(12) United States Patent
Fukuzawa et al.

(10) Patent No.: US 8,169,752 B2
(45) Date of Patent: May 1, 2012

(54) METHOD FOR MANUFACTURING A MAGNETO-RESISTANCE EFFECT ELEMENT HAVING SPACER LAYER

(75) Inventors: Hideaki Fukuzawa, Kawasaki (JP); Hiromi Yuasa, Kawasaki (JP); Yoshihiko Fuji, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1331 days.

(21) Appl. No.: 11/822,545

(22) Filed: Jul. 6, 2007

(65) Prior Publication Data

US 2008/0102315 A1    May 1, 2008

(30) Foreign Application Priority Data

Jul. 7, 2006   (JP) ................. P2006-188712

(51) Int. Cl.
  *G11B 5/33* (2006.01)
(52) U.S. Cl. ............................. 360/324.1
(58) Field of Classification Search .......... None
  See application file for complete search history.

(56) References Cited

U.S. PATENT DOCUMENTS

| | | | |
|---|---|---|---|
| 6,937,446 B2 | 8/2005 | Kamiguchi et al. |
| 7,046,489 B2 | 5/2006 | Kamiguchi et al. |
| 7,116,529 B2 | 10/2006 | Yoshikawa et al. |
| 7,196,877 B2 | 3/2007 | Yoshikawa et al. |
| 7,223,485 B2 | 5/2007 | Yuasa et al. |
| 7,331,100 B2 | 2/2008 | Li et al. |
| 7,379,278 B2 | 5/2008 | Koui et al. |
| 7,390,529 B2 | 6/2008 | Li et al. |
| 7,514,117 B2 | 4/2009 | Fukuzawa et al. |
| 2002/0048127 A1 | 4/2002 | Fukuzawa et al. |
| 2002/0048128 A1* | 4/2002 | Kamiguchi et al. ....... 360/324.1 |
| 2003/0123200 A1* | 7/2003 | Nagasaka et al. ......... 360/324.1 |

(Continued)

FOREIGN PATENT DOCUMENTS

CN    1431651    7/2003

(Continued)

OTHER PUBLICATIONS

Office Action in Chinese Application No. 2007101286788 dated Nov. 14, 2008 and partial English-language translation thereof.

(Continued)

*Primary Examiner* — David D Davis
(74) *Attorney, Agent, or Firm* — Nixon & Vanderhye, P.C.

(57) ABSTRACT

In a method for manufacturing a magneto-resistance effect element having a pinned magnetic layer of which a magnetization is fixed substantially in one direction, a free magnetization layer of which a magnetization is rotated in accordance with an external magnetic field and a spacer layer, which is located between the fixed magnetization layer and the free magnetization layer, with an insulating layer and a metallic layer penetrating through the insulating layer, the spacer layer is formed by forming a first metallic layer; forming, on the first metallic layer, a second metallic layer to be converted into a portion of the insulating layer; performing a first conversion treatment so as to convert the second metallic layer into the portion of said insulating layer and to form a portion of the metallic layer penetrating through the insulating layer; forming, on the insulating layer and the metallic layer formed through the first conversion treatment, a third metallic layer to be converted into the other portion of the insulating layer; and performing a second conversion treatment so as to convert the third metallic layer into the other portion of the insulating and to form the other portion of the metallic layer penetrating through the insulating layer.

14 Claims, 10 Drawing Sheets

U.S. PATENT DOCUMENTS

| | | |
|---|---|---|
| 2004/0021990 A1 | 2/2004 | Koui et al. |
| 2004/0201929 A1 | 10/2004 | Hashimoto et al. |
| 2006/0034022 A1 | 2/2006 | Fukuzawa et al. |
| 2006/0098353 A1* | 5/2006 | Fukuzawa et al. ......... 360/324.1 |
| 2006/0164764 A1 | 7/2006 | Kamiguchi et al. |
| 2006/0181814 A1 | 8/2006 | Koui et al. |
| 2008/0013218 A1* | 1/2008 | Fuke et al. .................... 360/313 |
| 2009/0061105 A1* | 3/2009 | Fukuzawa et al. ............ 427/539 |

FOREIGN PATENT DOCUMENTS

| | | |
|---|---|---|
| CN | 1746980 A | 3/2006 |
| EP | 1 626 393 A2 | 2/2006 |
| JP | 2002-076473 | 3/2002 |
| JP | 2002-208744 | 7/2002 |
| JP | 2004-153248 | 5/2004 |
| JP | 2004-214234 | 7/2004 |
| JP | 2006-054257 | 2/2006 |
| JP | 2006-319343 | 11/2006 |
| KR | 10-2006-0050327 | 5/2006 |

OTHER PUBLICATIONS

Hideaki Fukuzawa et al., "MR Ratio Enhancement by NOL Current-Confined-Path Structures in CPP Spin Valves", IEEE Transactions on Magnetics, Jul. 2004, vol. 40, No. 4, pp. 2236-2238.

Fukuzawa et al., U.S. Appl. No. 11/199,448, filed Aug. 9, 2005.

Hideaki Fukuzawa et al. "MR Ratio Enhancement by NOL Current-Confined-Path Structures in CPP Spin Values", IEEE Transactions on Magnetics, vol. 40, No. 4, pp. 2236-2238.

* cited by examiner

METHOD FOR MANUFACTURING A MAGNETO-RESISTANCE EFFECT ELEMENT HAVING SPACER LAYER

CROSS-REFERENCE TO RELATED APPLICATIONS

This application is based upon and claims the benefit of priority from the prior Japanese Patent Application No. 2006-188712, filed on Jul. 7, 2006; the entire contents of which are incorporated herein by reference.

BACKGROUND OF THE INVENTION

1. Field of the Invention

The present invention relates to a method for manufacturing a magneto-resistance effect element which is configured such that a current is flowed in the direction perpendicular to the film surface thereof to detect the magnetization of the element and the magneto-resistance effect element.

2. Description of the Related Art

Recently, the performance of a magnetic device, particularly such as a magnetic head is enhanced by means of Giant Magneto-Resistive Effect (GMR). Particularly, since a spin valve film (SV film) can exhibit a larger GMR effect, the SV film has developed the magnetic device such as a magnetic head and MRAM (Magnetic Random Access Memory).

The "spin valve" film has such a structure as sandwiching a non-magnetic metal spacer layer between two ferromagnetic layers and is configured such that the magnetization of one ferromagnetic layer (often called as a "pinning layer" or "fixed magnetization layer) is fixed by the magnetization of an anti-ferromagnetic layer and the magnetization of the other ferromagnetic layer (often called as a "free layer" or "free magnetization layer") is rotated in accordance with an external magnetic field.

The spin valve film is employed for a CIP (Current I plane)-GMR element, a CPP (Current Perpendicular to Plane)-GMR element and a TMR (Tunneling Magneto Resistance) element. In the CIP-GMR element, a sense current is flowed to the SV film in the direction parallel to the film surface thereof. In the CPP-GMR element and the TMR element, a sense current is flowed to the SV film in the direction almost perpendicular to the film surface thereof. In view of the development of a high density recording head, attention is paid to such an element as configured so that the sense current is flowed perpendicular to the film surface.

In a metallic CPP-GMR element, since the SV film is composed of metallic films, the resistance change by the magnetization change of the free layer becomes small so that weak magnetic (from a magnetic disk of high recording density) field can not be detected.

In contrast, such a CPP element as containing an oxide layer with current path therein (NOL: Nano-oxide layer) is proposed (Reference 1). In the CPP element, the element resistance and the MR variation degree of the element can be developed by means of CCP (Current-confined-path) element. Hereinafter, the CPP element is often called as a "CCP-CPP element".

[Reference 1] JP-A 2002-208744 (KOKAI)

Such a magnetic recording device as an HDD is widely available for a personal computer, a portable music player and the like. In the future, however, the reliability of the magnetic recording device is severely required when the usage of the magnetic recording device is increased and the high density recording is also developed. It is required, for example, that the reliability of the magnetic recording device is developed under a high temperature condition or a high speed operation. In this point of view, it is desired to much develop the reliability of the magnetic head in comparison with the conventional one.

Particularly, since the CCP-CPP element has a smaller resistance than the one of the conventional TMR element, the CCP-CPP element can be applied for a high end magnetic recording device of server enterprise requiring higher transfer rate. In the use of the high end magnetic recording device, both of the high density recording and the high reliability must be satisfied. Also, the high reliability under a higher temperature condition must be preferably satisfied. In other words, the CCP-CPP element is required to be used under the more severe condition (e.g., high temperature condition) and the more severe operation (e.g., the information being read out while the magnetic disk is rotated at high speed).

Since the resistance of the CCP-CPP element is small, the CCP-CPP element can exhibit some advantages such as high frequency response and high density recording correspondency. Since the three-dimensional structure of the NOL is very complicated, the NOL structure can not be almost realized as designed. In contrast, in order to realize the server enterprise requiring severe specifications, the NOL structure must be formed as designed.

BRIEF SUMMARY OF THE INVENTION

According to an aspect of the present invention related to a method for manufacturing a magneto-resistance effect element having a pinned magnetic layer of which a magnetization is fixed substantially in one direction, a free magnetization layer of which a magnetization is rotated in accordance with an external magnetic field and a spacer layer, which is located between the fixed magnetization layer and the free magnetization layer, with an insulating layer and a metallic layer penetrating through the insulating layer, includes: forming a first metallic layer; forming, on the first metallic layer, a second metallic layer to be converted into a portion of the insulating layer; performing a first conversion treatment so as to convert the second metallic layer into the portion of the insulating layer and to form a portion of the metallic layer penetrating through the insulating layer; forming, on the insulating layer and the metallic layer formed through the first conversion treatment, a third metallic layer to be converted into the other portion of the insulating layer; and performing a second conversion treatment so as to convert the third metallic layer into the other portion of the insulating and to form the other portion of the metallic layer penetrating through the insulating layer.

DETAILED DESCRIPTION OF THE INVENTION

Hereinafter, the present invention will be described in detail with reference to the drawings.
(Magneto-Resistance Effect Element)

Figure 1:
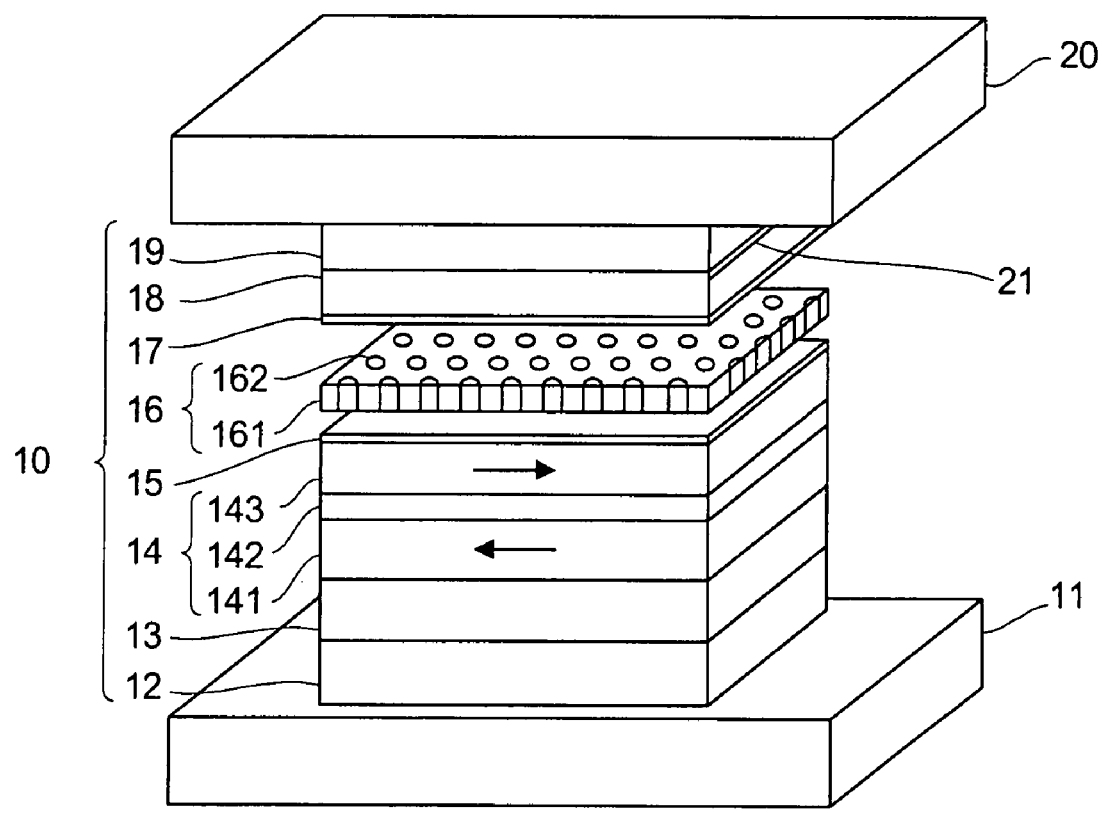
FIG. 1 is a perspective view illustrating an embodiment of the magneto-resistance effect element (CCP-CPP element) according to the present invention.

FIG. 1 is a perspective view illustrating a magneto-resistance effect element (CCP-CPP type element) according to an embodiment of the present invention. Some or all components throughout the drawings in the present application are schematically illustrated so that the illustrated sizes (thickness) and thickness ratio for the components is different from the real sizes and thickness ratio for the components.

The magneto-resistance effect element illustrated in FIG. 1 includes a magneto-resistance effect element 10, a top electrode 11 and a bottom electrode 20 which are disposed so as to sandwich the magneto-resistance effect element 10. Herein, the illustrated stacking structure is formed on a base (not shown).

The magneto-resistance effect element 10 includes an underlayer 12, a pinning layer 13, a pinned layer 14, a bottom metallic layer 15, a CCP-NOL layer 16 (an insulating layer 161 and a current confined path 162), a top metallic layer 17, a free layer 18 and a cap layer 19 which are subsequently stacked and formed. Among them, the pinned layer 14, the bottom metallic layer 15, the CPP-NOL layer 16, the top metallic layer 17 and the free layer 18 constitute a spin valve film which is configured such that the non-magnetic spacer layer is sandwiched between the two ferromagnetic layers. The bottom metallic layer 15, the CCP-NOL layer 16 and the top metallic layer 17 constitute the spacer layer entirely. In FIG. 1, for clarifying the structural feature of the magneto-resistance effect element, the thin oxide layer 16 is represented under the condition that the thin oxide layer 16 is separated from the upper and lower layers (the bottom metallic layer 15 and the top metallic layer 17).

Then, the components of the magneto-resistance effect element will be described. The bottom electrode 11 functions as an electrode for flowing a current in the direction perpendicular to the spin valve film. In real, the current can be flowed through the spin valve film in the direction perpendicular to the film surface thereof by applying a voltage between the bottom electrode 11 and the top electrode 20. The change in resistance of the spin valve film originated from the magneto-resistance effect can be detected by utilizing the current. In other words, the magnetization detection can be realized by the current flow. The bottom electrode 11 is made of a metallic layer with a relatively small electric resistance for flowing the current to the magneto-resistance effect element sufficiently. For example, the bottom electrode 11 may be made of NiFe or Cu.

The underlayer 12 may be composed of a buffer layer 12a and a seed layer 12b. The buffer layer 12a can be employed for the compensation of the surface roughness of the bottom electrode 11. The seed layer 12b can be employed for controlling the crystalline orientation and the crystal grain size of the spin valve film to be formed on the underlayer 12.

The buffer layer 12a may be made of Ta, Ti, W, Zr, Hf, Cr or an alloy thereof. The thickness of the buffer layer 12a is preferably set within 2 to 10 nm, more preferably set within 3 to 5 nm. If the buffer layer 12a is formed too thin, the buffer layer 12a can not exhibit the inherent buffering effect. If the buffer layer 12a is formed too thick, the Resistance not contributing to the MR variation may be increased. If the seed layer 12b can exhibit the buffering effect, the buffer layer 12a may be omitted. In a preferable example, the buffer layer 12a is made of a Ta layer with a thickness of 3 nm.

The seed layer 12b may be made of any material controllable for the crystalline orientation of (a) layer (s) to be formed thereon. For example, the seed layer 12b may be made preferably of a metallic layer with a fcc-structure (face-centered cubic structure), a hcp-structure (hexagonal close-packed structure) or a bcc-structure (body-centered cubic structure). Concretely, the seed layer 12b may be made of Ru with hcp-structure or NiFe with fcc-structure so that the crystalline orientation of the spin valve film to be formed thereon can be rendered an fcc (111) faced orientation. In this case, the crystalline orientation of the pinning layer 13 (e.g., made of IrMn) can be rendered an fcc (face-centered cubic) structure. The seed layer 12b may be made of Cr, Zr, Ti, Mo, Nb, W or an alloy thereof instead of Ru and NiFe.

In order to exhibit the inherent seed effect of the seed layer 12b of enhancing the crystalline orientation sufficiently, the thickness of the seed layer 12b is set preferably within 1 to 5 nm, more preferably within 1.5 to 3 nm. In a preferable example, the seed layer 12b may be made of a Ru layer with a thickness of 2 nm.

The crystalline orientation for the spin valve film and the pinning layer 13 can be measured by means of X-ray diffraction. For example, the FWHMs (full width at half maximum) in X-ray rocking curve of the fcc (111) peak of the spin valve film, the fct (111) peak or the bcc (110) peak of the pinning layer 13 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 12b may be made of a NiFe-based alloy (e.g., $Ni_xFe_{100-x}$: X=90 to 50%, preferably 75 to 85%) layer of a NiFe-based non-magnetic (($Ni_xFe_{100-x})_{100-Y}X_Y$: X=Cr, V, Nb, Hf, Zr, Mo)) layer instead of Ru. In the latter case, the addition of the third element "X" renders the seed layer 12b non-magnetic. The crystalline orientation of the seed layer 12b of the NiFe-based alloy can be enhanced easily so that the FWHM in X-ray rocking curve can be rendered within a range of 3 to 5 degrees.

The seed layer 12b functions not only as the enhancement of the crystalline orientation, but also as the control of the crystal grain size of the spin valve film. Concretely, the crystal grain size of the spin valve film can be controlled within a range of 5 to 40 nm so that the fluctuation in performance of the magneto-resistance effect element can be prevented, and thus, the higher MR ratio can be realized even though the magneto-resistance effect element is downsized. MR ratio is defined as dR/R, where dR is resistance change between the largest resistance and the smallest resistance by applying magnetic field, and R is the smallest resistance.

The crystal grain size of the spin valve film can be determined on the crystal grain size of the layer formed on the seed layer $12b$ by means of cross section TEM. In the case of a bottom type spin valve film where the pinning layer $14$ is located below the spacer layer $16$, the crystal grain size of the spin valve film can be determined on the crystal grain size of the pinning layer $13$ (antiferromagnetic layer) or the pinned layer $14$ (fixed magnetization layer) to be formed on the seed layer $12b$.

With a read head in view of high recording density, the element size is set to 100 nm or below, for example. Therefore, if the crystal grain size is set comparable for the element size, the element characteristics may be fluctuated. In this point of view, it is not desired that the crystal grain size of the spin valve film is set larger than 40 nm. Concretely, the crystal grain size of the spin valve film is set preferably within 5 to 40 nm, more preferably within 5 to 20 nm.

Too large crystal grain size may cause the decrease of the number of crystal grain per element surface so as to cause fluctuation in characteristics of the read head. With the CCP-CPP element forming a current confined path, it is not desired to increase the crystal grain size than a prescribed grain size. In contrast, too small crystal grain size may deteriorate the crystalline orientation. In this point of view, it is required that the crystal grain size is determined in view of the upper limited value and the lower limited value, e.g., within a range of 5 to 20 nm.

With the use of MRAM, however, the element size may be increased to 100 nm or over so that the crystal grain size can be increased to about 40 nm without the above-mentioned problem. Namely, if the seed layer $12b$ is employed, the crystal grain size may be increased than the prescribed grain size.

In order to set the crystal grain size within 5 to 20 nm, the seed layer $12b$ may be made of a Ru layer with a thickness of 2 nm or a NiFe-based non-magnetic (($Ni_xFe_{100-x}$)$_{100-y}X_y$: X=Cr, V, Nb, Hf, Zr, Mo, preferably y=0 to 30%)) layer.

In contrast, in the case that the crystal grain size is increased more than 40 nm and thus, is rendered coarse, the content of the third additive element is preferably increased more than the value described above. For example, with NiFeCr alloy, the content of Cr is preferably set within 35 to 45% so as to set the composition of the NiFeCr alloy to the composition exhibiting intermediate phase structure between the fcc-structure and the bcc-structure. In this case, the resultant NiFeCr layer can have the bcc-structure.

As descried above, the thickness of the seed layer $12b$ is set preferably within 1 to 5 nm, more preferably within 1.5 to 3 nm. Too thin seed layer $12b$ may deteriorate the crystalline orientation controllability. In contrast, too thick seed layer $12b$ may increase the Resistance of the element and rough the interface for the spin valve film.

The pinning layer $13$ functions as applying the unidirectional anisotropy to the ferromagnetic layer to be the pinned layer $14$ on the pinning layer $13$ and fixing the magnetization of the pinned layer $14$. The pinning layer $13$ may be made of an antiferromagnetic material such as PtMn, PdPtMn, IrMn, RuRhMn. In view of the use of the element as a high density recording head, the pinning layer $13$ is preferably made of IrMn because the IrMn layer can apply the unidirectional anisotropy to the pinned layer $14$ in comparison with the PtMn layer even though the thickness of the IrMn layer is smaller than the thickness of the PtMn layer. In this point of view, the use of the IrMn layer can reduce the gap width of the intended element for high density recording.

In order to apply the unidirectional anisotropy with sufficient intensity, the thickness of the pining layer $13$ is appropriately controlled. In the case that the pinning layer $13$ is made of PtMn or PdPtMn, the thickness of the pinning layer $13$ is set preferably within 8 to 20 nm, more preferably within 10 to 15 nm. In the case that the pinning layer $13$ is made of IrMn, the unidirectional anisotropy can be applied even though the thickness of the pinning layer $13$ of IrMn is set smaller than the thickness of the pinning layer $13$ of PtMn. In this point of view, the thickness of the pinning layer $13$ of IrMn is set preferably within 3 to 12 nm, more preferably within 4 to 10 nm. In a preferred embodiment, the thickness of the IrMn pinning layer $13$ is set to 7 nm.

The pinning layer $13$ may be made of a hard magnetic layer instead of the antiferromagnetic layer. For example, the pinning layer $13$ may be made of CoPt (Co=50 to 85%), ($CoPt_{100-x}$)$_{100-y}Cr_y$: X=50 to 85%, Y=0 to 40%) or FePt (Pt=40 to 60%). Since the hard magnetic layer has a smaller specific resistance, the Resistance and the surface resistance RA of the element can be reduced.

In a preferred embodiment, the pinned layer (fixed magnetization layer) $14$ is formed as a synthetic pinned layer composed of the bottom pinned layer $141$ (e.g., $Co_{90}Fe_{10}$ 3.5 nm), the magnetic coupling layer $142$ (e.g., Ru) and the top pinned layer $143$ (e.g., ($Fe_{50}CO_{50}$ 1 nm/Cu 0.25 nm)×2/$Fe_{50}CO_{50}$ 1 nm). The pinning layer $13$ (e.g., IrMn layer) is coupled via magnetic exchange with the bottom pinned layer $141$ formed on the pinning layer $13$ so as to apply the unidirectional anisotropy to the bottom pinned layer $141$. The bottom pinned layer $141$ and the top pinned layer $143$ which are located under and above the magnetic coupling layer $142$, respectively, are strongly magnetically coupled with one another so that the direction of magnetization in the bottom pinned layer $141$ becomes anti-paralleled to the direction of magnetization in the top pinned layer $143$.

The bottom pinned layer $141$ may be made of $Co_xFe_{100-X}$ alloy (X=0 to 100), $Ni_xFe_{100-X}$ (X=0 to 100) or an alloy thereof containing a non magnetic element. The bottom pinned layer $141$ may be also made of a single element such as Co, Fe, Ni or an alloy thereof.

It is desired that the magnetic thickness (saturation magnetization Bs×thickness t (Bs·t)) of the bottom pinned layer $141$ is set almost equal to the one of the top pinned layer $143$. Namely, it is desired that the magnetic thickness of the top pinned layer $143$ corresponds to the magnetic thickness of the bottom pinned layer $141$. For example, when the top pinned layer $143$ of ($Fe_{50}Co_{50}$ 1 nm/Cu 0.25 nm)×2/$Fe_{50}Co_{50}$ 1 nm is employed, the magnetic thickness of the top pinned layer $143$ is set to 2.2 T×3 nm=6.6 T nm because the saturation magnetization of the top pinned layer $143$ is about 2.2 T. When the bottom pinned layer $141$ of $Co_{90}Fe_{10}$ is employed, the thickness of the bottom pinned layer $141$ is set to 6.6 T nm/1.8 T=3.66 nm for the magnetic thickness of 6.6 T nm because the saturation magnetization of $Co_{90}Fe_{10}$ is about 1.8 T. Note that the saturation magnetization of the film is smaller than that of bulk materials. In this point of view, it is desired that the thickness of the bottom pinned layer $141$ made of $Co_{90}Fe_{10}$ is set to about 3.6 nm. When the pinning layer $13$ is made of IrMn, the composition of the bottom pinned layer $141$ is set preferably to a composition containing Fe by a larger content than $Co_{90}Fe_{10}$. Concretely, the bottom pinned layer $141$ may be made of $CO_{75}Fe_{25}$.

The thickness of the bottom pinned layer $141$ is preferably set within 1.5 to 4 nm in view of the magnetic strength of the unidirectional anisotropy relating to the pinning layer $13$ (e.g., IrMn layer) and the magnetic strength of the antiferromagnetic coupling between the bottom pinned layer 141 and the top pinned layer 143 via the magnetic coupling layer 142 (e.g., Ru layer). Too thin bottom pinned layer 141 causes the decrease of the MR ratio. In contrast, too thick bottom pinned layer 141 causes the difficulty of obtaining the unidirectional anisotropy magnetic field requiring for the operation of the element. In a preferred embodiment, the bottom pinned layer 141 may be made of a $Co_{75}Fe_{25}$ layer with a thickness of 3.6 nm.

The magnetic coupling layer 142 (e.g., Ru layer) causes the antiferromatic coupling between the bottom pinned layer 141 and the top pinned layer 143 which are located under and above the magnetic coupling layer 142. In the case that the magnetic coupling layer 142 is made of the Ru layer, the thickness of the Ru layer is preferably set within 0.8 to 1 nm. As long as the antiferromagnetic coupling between the pinned layers located under and above the magnetic coupling layer 142 can be generated, the magnetic coupling layer 142 may be made of another material except Ru or the thickness of the magnetic coupling layer 142 may be varied within 0.3 to 0.6 nm instead of the thickness range of 0.8 to 1 nm. The former thickness range of 0.3 to 0.6 nm corresponds to the first peak of RKKY (Runderman-Kittel-Kasuya-Yoshida) coupling, and the latter thickness range of 0.8 to 1 nm corresponds to the second peak of RKKY. With the thickness range of the first peak of RKKY coupling, the magnetic coupling layer 142 can exhibit an extremely large antiferromagnetic fixing strength, but the allowable thickness range of the magnetic coupling layer 142 is reduced. In a preferred embodiment, the magnetic coupling layer 142 may be made of the Ru layer with a thickness of 0.9 nm so as to realize the antiferromagnetic coupling for the pinned layers stably.

The top pinned layer 143 may be made of ($Fe_{50}Co_{50}$ 1 nm/Cu 0.25 nm)×2/$Fe_{50}Co_{50}$ 1 nm. The top pinned layer 143 composes a part of the spin dependent scattering unit. The top pinned layer 143 can contribute directly to the MR effect, and thus, the material and thickness of the top pinned layer 143 are important so as to realize a large MR ratio. The magnetic material of the top pinned layer 143 to be positioned at the interface for the CCP-NOL layer 16 is important in view of the contribution of the spin dependent interface scattering.

Then, the effect/function of the top pinned layer 143 of the $Fe_{50}Co_{50}$ layer with bcc-structure will be described. In this case, since the spin dependent interface scattering is enhanced, the MR ratio can be enhanced. As the FeCo-based alloy with bcc-structure, a $Co_xFe_{100-x}$ alloy (X=30 to 100) or a similar CoFe-based alloy containing an additive element can be exemplified. Among them, a $Fe_{40}Co_{60}$ alloy through a $Fe_{60}Co_{40}$ alloy may be employed in view of the above-described requirements.

In the case that the top pinned layer 143 is made of the magnetic layer with bcc-structure easily exhibiting the large MR ratio, the thickness of the top pinned layer 143 is preferably set to 1.5 nm or over so as to maintain the bcc-structure thereof stably. Since the spin valve film is made mainly of a metallic material with fcc-structure or fct-structure, only the top pinned layer 143 may have the bcc-structure. In this point of view, too thin top pinned layer 143 can not maintain the bcc-structure thereof stably so as not to obtain the large MR ratio.

Herein, the top pinned layer 143 is made of the $Fe_{50}Co_{50}$ layers and the extremely thin Cu layers. The total thickness of the $Fe_{50}Co_{50}$ layers is 3 nm and each Cu layer is formed on the corresponding $Fe_{50}Co_{50}$ layer with a thickness of 1 nm. The thickness of the Cu layer is 0.25 nm and the total thickness of the top pinned layer 143 is 3.5 nm.

It is desired that the thickness of the top pinned layer 143 is set to 5 nm or below so as to generate a large pinning (fixing) magnetic field. In view of the large pinning (fixing) magnetic field and the stability of the bcc-structure in the top pinned layer 143, the thickness of the top pinned layer 143 is preferably set within 2 to 4 nm.

The top pinned layer 143 may be made of a $Co_{90}Fe_{10}$ alloy with fcc-structure or a Co alloy with hcp-structure which used to be widely employed for a conventional magneto-resistance effect element, instead of the magnetic material with the bcc-structure. The top pinned layer 143 can be made of a single element such as Co, Fe, Ni or an alloy containing at least one of Co, Fe, Ni. In view of the large MR ratio of the top pinned layer 143, the FeCo alloy with the bcc-structure, the Co alloy containing Co element of 50% or over and the Ni alloy containing Ni element of 50% or over are in turn preferable.

In this embodiment, the top pinned layer 143 is made of a stacking structure where the magnetic layers (FeCo layers) and the non magnetic layers (extremely thin Cu layers) are alternately stacked. In this case, the top pinned layer 143 can enhance the spin dependent scattering effect which is also called as a "spin dependent bulk scattering effect", originated from the extremely thin Cu layers.

The spin dependent bulk scattering effect is utilized in pairs for the spin dependent interface scattering effect. The spin dependent bulk scattering effect means the occurrence of an MR effect in a magnetic layer and the spin dependent interface scattering effect means the occurrence of an MR effect at an interface between a spacer layer and a magnetic layer.

Hereinafter, the enhancement of the bulk scattering effect of the stacking structure of the magnetic layers and the non magnetic layers will be described. With the CCP-CPP element, since a current is confined in the vicinity of the CCP-NOL layer 16, the resistance in the vicinity of the CCP-NOL layer 16 contributes the total resistance of the magneto-resistance effect element. Namely, the resistance at the interface between the CCP-NOL layer 16 and the magnetic layers (pinned layer 14 and the free layer 18) contributes largely to the magneto-resistance effect element. That means the contribution of the spin dependent interface scattering effect becomes large and important in the CCP-CPP element. The selection of magnetic material located at the interface for the CCP-NOL layer 16 is important in comparison with a conventional CPP element. In this point of view, the pinned layer 143 is made of the FeCo alloy with the bcc-structure exhibiting the large spin dependent interface scattering effect as described above.

However, it may be that the spin dependent bulk scattering effect should be considered so as to develop the MR ratio. In view of the development of the spin dependent bulk scattering effect, the thickness of the thin Cu layer is set preferably within 0.1 to 1 nm, more preferably within 0.2 to 0.5 nm. Too thin Cu layer can not develop the spin dependent bulk scattering effect sufficiently. Too thick Cu layer may reduce the spin dependent bulk scattering effect and weaken the magnetic coupling between the magnetic layers via the non magnetic Cu layer, which the magnetic layers sandwiches the non magnetic Cu layer, thereby deteriorating the property of the pinned layer 14. In a preferred embodiment, in this point of view, the thickness of the non-magnetic Cu layer is set to 0.25 nm.

The non-magnetic layer sandwiched by the magnetic layers may be made of Hf, Zr, Ti, Al instead of Cu. In the case that the pinned layer 14 contains the non-magnetic layer(s), the thickness of the one magnetic layer such as a FeCo layer which is separated by the non-magnetic layer is set preferably within 0.5 to 2 nm, more preferably within 1 to 1.5 nm.

In the above embodiment, the top pinned layer 143 is constituted of the alternately stacking structure of FeCo layer and Cu layer, but may be made of an alloyed layer of FeCo and Cu. The composition of the resultant FeCoCu alloy may be set to $((Fe_xCo_{100-x})_{100-Y}Cu_Y$: X=30 to 100% Cr, Y=3 to 15%), but set to another composition range. The third element to be added to the main composition of FeCo may be selected from Hf, Zr, Ti, Al instead of Cu.

The top pinned layer 143 may be also made of a single element such as Co, Fe, Ni or an alloy thereof. In a simplified embodiment, the top pinned layer 143 may be made of an $Fe_{90}Co_{10}$ layer with a thickness of 2 to 4 nm, as occasion demands, containing a third additive element.

Then, the spacer layer will be concretely described. The bottom metallic layer 15 is employed for the formation of the current confined path 162 and thus, functions as a supplier for the current confined path 162. It is not required that the bottom metallic layer 15 remains as it is apparently after the formation of the current confined path 162. Therefore, the bottom metallic layer is often diminished after the formation of the current confined path 162.

The CCP-NOL (spacer layer) 16 includes the insulating layer 161 and the current confined path 162. The spacer layer in the broad sense is constituted of the CCP-NOL (spacer layer) 16, the bottom metallic layer 15 and the top metallic layer 17.

The insulating layer 161 is made of oxide, nitride, oxynitride or the like. For example, the insulating layer 161 may be made of an $Al_2O_3$ amorphous structure or an MgO crystalline structure. In order to exhibit the inherent function of the spacer layer, the thickness of the insulating layer 161 is set preferably within 1 to 3.5 nm, more preferably within 1.5 to 3 nm.

As shown in FIG. 1, since the CCP structure of the spacer layer is complicated and must be formed three-dimensionally in the order of nano-meter, it is difficult to form the CCP structured spacer layer. However, the CCP structured spacer layer can be formed easily as designed according to the manufacturing method of the present invention. The manufacturing method is important and essential in the present embodiment (invention) and will be described in detail, hereinafter.

The insulating layer 161 may be made of a typical insulating material such as $Al_2O_3$-based material, as occasion demands, containing a third additive element such as Ti, Hf, Mg, Zr, V, Mo, Si, Cr, Nb, Ta, W, B, C, V. The content of the additive element may be appropriately controlled within 0 to 50%. In a preferred embodiment, the insulating layer 161 is made of an $Al_2O_3$ layer with a thickness of about 2 nm.

The insulating layer 161 may be made of Ti oxide, Hf oxide, Mg oxide, Zr oxide, Cr oxide, Ta oxide, Nb oxide, Mo oxide, Si oxide or V oxide instead of the Al oxide such as the $Al_2O_3$. In the use of another oxide except the Al oxide, a third additive element such as Ti, Hf, Mg, Zr, V, Mo, Si, Cr, Nb, Ta, W, B, C, V may be added to the oxide as occasion demands. The content of the additive element may be appropriately controlled within 0 to 50%.

The insulating layer 161 may be also made of a nitride or an oxynitride containing, as a base material, Al, Si, Hf, Ti, Mg, Zr, V, Mo, Nb, Ta, W, B, C only if the insulating layer 161 can exhibit the inherent insulating function.

The current confined path 162 functions as a path to flow a current in the direction perpendicular to the film surface of the CCP-NOL layer 16 and then, confining the current. The current confined path 162 also functions as a conductor to flow the current in the direction perpendicular to the film surface of the insulating layer 161 and is made of a metal such as Cu. In other words, the spacer layer 16 exhibits the current-confined path structure (CCP structure) so as to enhance the MR ratio from the current confining effect.

The current confined path 162 (CCP) may be made of Au, Ag, Ni, Co, Fe or an alloy containing at least one from the listed elements instead of Cu. In a preferred embodiment, the current confined path 162 is made of a Cu alloy. The current confined path 162 may be made of an alloy layer of CuNi, CuCo or CuFe. Herein, the content of Cu in the alloy is set preferably to 50% or over in view of the enhancement of the MR ratio and the reduction of the interlayer coupling field, Hin between the pinned layer 14 and the free layer 18.

The content in oxygen and nitrogen of the current confined path 162 is much smaller than (at least half as large as) the one of the insulating layer 161. The current confined path 162 is generally crystallized. Since the resistance of the crystalline phase is smaller than the resistance of the non-crystalline phase, the current confined path 162 can easily conduct the inherent function.

The top metallic layer 17 composes the spacer layer in the broad sense and functions as a barrier layer protecting the oxidization of the free layer 18 to be formed thereon through the contact with the oxide of the CCP-NOL layer 16 so that the crystal quality of the free layer 18 cannot be deteriorated. For example, when the insulating layer 161 is made of an amorphous material (e.g., $Al_2O_3$), the crystal quality of a metallic layer to be formed on the layer 161 may be deteriorated, but when a layer (e.g., Cu layer) to develop the crystal quality of fcc-structure is provided (under the condition that the thickness of the metallic layer is set to 1 nm or below), the crystal quality of the free layer 18 can be remarkably improved.

It is not always required to provide the top metallic layer 17 dependent on the kind of material in the CCP-NOL layer 16 and/or the free layer 18. Moreover, if the annealing condition is optimized and the appropriate selection of the materials of the insulating layer 161 of the thin oxide layer 16 and the free layer 18 is performed, the deterioration of the crystal quality of the free layer 18 can be prevented, thereby omitting the metallic layer 17 of the CCP-NOL layer 16.

In view of the manufacturing yield of the magneto-resistance effect element, it is desired to form the top metallic layer 17 on the CCP-NOL layer 16. In a preferred embodiment, the top metallic layer 17 can be made of a Cu layer with a thickness of 0.5 nm.

The top metallic layer 17 may be made of Au or Ag instead of Cu. Moreover, it is desired that the top metallic layer 17 is made of the same material as the material of the current confined path 162 of the CCP-NOL layer 16. If the top metallic layer 17 is made of a material different from the material of the current confined path 162, the interface resistance between the layer 17 and the path 162 is increased, but if the top metallic layer 17 is made of the same material as the material of the current confined path 162, the interface resistance between the layer 17 and the path 162 is not increased.

The thickness of the top metallic layer 17 is set preferably within 0 to 1 nm, more preferably within 0.1 to 0.5 nm. Too thick top metallic layer 17 may extend the current confined through the spacer layer 16 thereat, resulting in the decrease of the MR ratio due to the insufficient current confinement.

The free layer 18 is a ferromagnetic layer of which the direction of magnetization is varied commensurate with the external magnetic field. For example, the free layer 18 is made of a double-layered structure of $Co_{90}Fe_{10}$ 1 nm/$Ni_{83}Fe_{17}$ 3.5 nm. In this case, it is desired that a CoFe alloy is formed at the interface for the spacer layer 16 than a NiFe alloy is formed.

In order to realize the large MR ratio, the selection of magnetic material of the free layer 18 in the vicinity of the spacer 16, that is, at the interface therebetween is important. The free layer 18 may be made of a single $Co_{90}Fe_{10}$ layer with a thickness of 4 nm without a NiFe layer or a triple-layered structure of CoFe/NiFe/CoFe.

Among CoFe alloys, the $Co_{90}Fe_{10}$ layer is preferably employed in view of the stable soft magnetic property. If a CoFe alloy similar in composition to the $Co_{90}Fe_{10}$ alloy is employed, it is desired that the thickness of the resultant CoFe alloy layer is set within 0.5 to 4 nm. Moreover, the free layer 18 may be made of $Co_xFe_{100-x}$ (X=70 to 90%).

Then, the free layer 18 is made of an alternately stacking structure of CoFe layers or Fe layers with a thickness of 1 to 2 nm and extremely thin Cu layers with a thickness of 0.1 to 0.8 nm.

In the case that the CCP-NOL layer 16 is made of the Cu layer, it is desired that the FeCo layer with bcc-structure is employed as the interface material thereof for the spacer layer 16 so as to enhance the MR ratio in the same manner as the pinned layer 14. As the FeCo layer with bcc-structure, the $Fe_xCo_{100-x}$ (X=30 to 100) or, as occasion demands, containing a third additive element, may be employed. In a preferred embodiment, a $Co_{90}Fe_{10}$ 1 nm/$Ni_{83}Fe_{17}$ 3.5 nm may be employed. Instead of the FeCo layer with bcc-structure, a CoFe layer with fcc-structure may be employed.

The cap layer 19 functions as protecting the spin valve film. The cap layer 19 may be made of a plurality of metallic layers, e.g., a double-layered structure of Cu 1 nm/Ru 10 nm. The layered turn of the Cu layer and the Ru layer may be switched so that the Ru layer is located in the side of the free layer 18. In this case, the thickness of the Ru layer is set within 0.5 to 2 nm. The exemplified structure is particularly desired for the free layer 19 of NiFe because the magnetostriction of the interface mixing layer formed between the free layer 18 and the cap layer 19 can be lowered due to the non-solution between Ru and Ni.

When the cap layer 19 is made of the Cu/Ru structure or the Ru/Cu structure, the thickness of the Cu layer is preferably set within 0.5 to 10 nm and the thickness of the Ru layer is set smaller, e.g., within 0.5 to 5 nm due to the large specific resistance.

The cap layer 19 may be made of another metallic layer instead of the Cu layer and/or the Ru layer. The structure of the cap layer 19 is not limited only if the cap layer 19 can protect the spin valve film. If the protective function of the cap layer 19 can be exhibited, the cap layer 19 may be made of still another metal. Attention should be paid to the cap layer because the kind of material of the cap layer may change the MR ratio and the long reliability. In view of the stable MR ratio and long reliability, the Cu layer and/or the Ru layer is preferable for the cap layer.

The top electrode 20 functions as flowing a current through the spin valve film in the direction perpendicular to the film surface of the spin valve film. The intended current can be flowed through the spin valve film in the direction perpendicular to the film surface by applying a voltage between the top electrode 20 and the bottom electrode 11. The top electrode 20 may be made of a material with smaller resistance (e.g., NiFe, Cu, or Au).

(Method for Manufacturing a Magneto-Resistance Effect Element)

Then, the method for manufacturing the magneto-resistance effect element will be described. FIG. 2 relates to views illustrating a forming process particularly relating to the spacer layers 15, 16 and 17 of the magneto-resistance effect element in the embodiment.

Figure 2A:
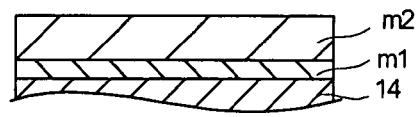
FIG. 2 relates to views illustrating a forming process of the spacer of the magneto-resistance effect element in the embodiment.

First of all, the substrate with the bottom electrode thereon is prepared, and the underlayer and the pinning layer (not shown) are formed on the substrate. Then, as shown in FIG. 2A, the pinned layer 14 is formed on the pinning layer. Then, the first metallic layer m1 (e.g., Cu) to be converted into the current confined path is formed on the pinned layer 14, and the second metallic layer m2 (e.g., AlCu or Al) to be converted into the insulating layer is formed on the first metallic layer m1.

Figure 2B:
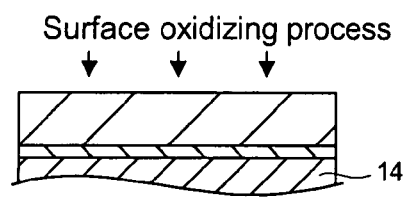
Figure 2C:
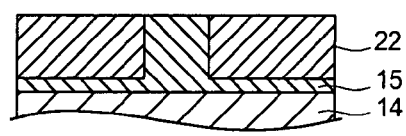

Then, as shown in FIGS. 2B and 2C, the surface oxidizing treatment and/or the surface nitriding treatment is performed onto the second metallic layer m2 so as to partially form the CCP structure of the insulating layer and the current confined path. The oxidizing treatment and the nitriding treatment will be described in detail, hereinafter. Since the second metallic layer m2 is converted into the corresponding insulating layer and the first metallic layer m1 is converted into the current confined path (metallic layer) by applying migration energy to the first metallic layer m1 according to the oxidizing treatment or the nitriding treatment, the oxidizing treatment and the nitriding treatment as shown in FIGS. 2B and 2C can be defined as a structure converting treatment to form the CPP structure (first converting treatment).

In FIG. 2C, the metallic layers m1 and m2 are formed thinner so as to form the ideal CPP structure. If the metallic layers m1 and m2 are formed thicker, the ideal CPP structure can not be formed as shown in FIG. 2C. Since the thinner metallic layers m1 and m2 can not function as the intended insulating layer after the conversion, and thus, the resultant NOL layer can not have the inherent insulation originated from the insulating layer, leak current may occur in the NOL and/or the dielectric breakdown may occur at a lower voltage in the NOL. Therefore, the NOL formed through the steps as shown in FIGS. 2A to 2C can not be practically employed. In this point of view, the steps as shown in FIGS. 2D to 2G are required.

Figure 2D:
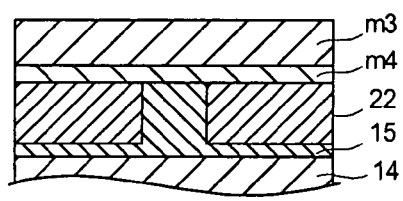

As shown in FIG. 2D, the fourth metallic layer m4 (e.g., made of Cu) to be converted into the current confined path is formed in the same manner as in FIG. 2A. Then, the third metallic layer m3 (e.g., made of AlCu or Al) to be converted into the insulating layer is formed on the fourth metallic layer m4.

Figure 2E:
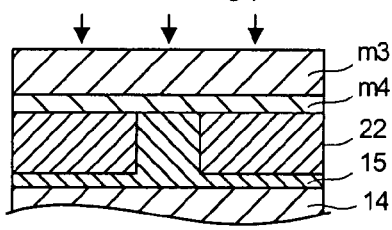
Figure 2F:
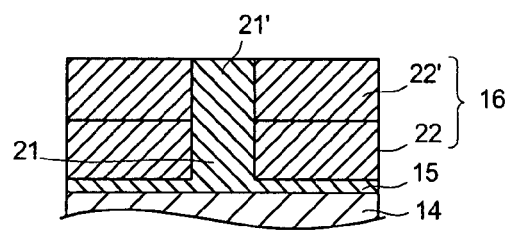

Then, as shown in FIG. 2E, the surface oxidizing treatment and/or the surface nitriding treatment is performed onto the third metallic layer m3 so as to partially form the CCP structure of the insulating layer and the current confined path in the same manner as in FIG. 2B, thereby forming the CPP structure as shown in FIG. 2F. The oxidizing treatment and the nitriding treatment will be described in detail, hereinafter. Since the third metallic layer m3 is converted into the corresponding insulating layer and the fourth metallic layer m4 is converted into the current confined path (metallic layer) by applying migration energy to the fourth metallic layer m4 according to the oxidizing treatment or the nitriding treatment, the oxidizing treatment and the nitriding treatment as shown in FIGS. 2E and 2F can be also defined as a structure converting treatment to form the CPP structure (second converting treatment).

In FIG. 2E, the metallic layers m3 and m4 are formed thinner so as to form the ideal CPP structure. If the metallic layers m3 and m4 are formed thicker, the ideal CPP structure can not be formed as shown in FIG. 2F. However, the thinner metallic layers m3 and m4 leads to the thinner insulating layer so that the resultant NOL can not have the sufficient insulation. In this embodiment, in contrast, since the bottom portion of the CCP-NOL structure is formed previously in the step as shown in FIG. 2C, even the thinner metallic layers m3 and m4 can impart the sufficient insulation to the resultant NOL because the top portion of the CCP-NOL structure is formed by the metallic layers m3 and m4, thereby thickening the insulating layer of the NOL. In this way, the ideal CCP-NOL structure can be formed as shown in FIG. 2F through the two step-NOL formation process.

Figure 2G:
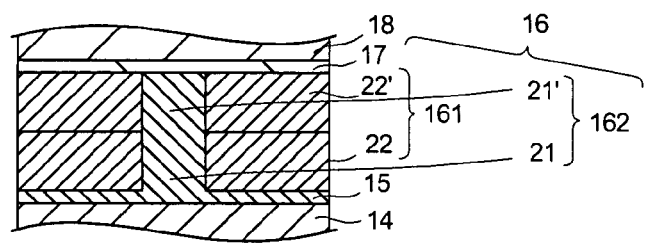

Then, as shown in FIG. 2G, the metallic layer 17 is formed on the spacer layer 16 as occasion demands, and the free layer is formed on the metallic layer 17 or the spacer layer 16. The metallic layer 17 functions as a protective layer of the free layer 18 against oxidation, but may be omitted.

In this embodiment, the purity of the current confined path 21 penetrating through the insulating layer 22 in the spacer layer 16 can be enhanced irrespective of the metallic layers (pinned layer 14 and the free layer 18) which are located above or below the spacer layer 16 and the intended CCP-NOL structure can be formed symmetrically in the vertical direction. As a result, the MR variation degree and reliability of the magneto-resistance effect element can be also enhanced when the magneto-resistance effect element includes the CCP-NOL structure in this embodiment.

In this embodiment, the fourth metallic layer m4 to form the current confined path (metallic layer) in the CCP-NOL structure is formed, but may not be formed. Without the fourth metallic layer m4, the elements of the first metallic layer m1 are moved upward by the migration energy originated from the second converting treatment, and infiltrated into the third metallic layer m3 to have been converted previously into the corresponding insulating layer so as to form the current confined path.

Then, each step will be described in detail. In FIG. 2A, the first metallic layer m1 is converted into the current confined path and the second metallic layer m2 is converted into the insulating layer by means of oxidizing treatment, nitriding treatment or oxynitriding treatment. The first metallic layer m1 is preferably made of Cu, Au, Ag, or Al. The second metallic layer m2 is preferably made of a material containing at least one selected from the group consisting of Al, Si, Mg, Ti, Hf, Zr, Cr, Mo, Nb and W, which the material can be converted into the corresponding insulating layer having excellent insulation through the oxidizing and/or nitriding. Concretely, the second metallic layer m2 may be made of a single element as listed above or an alloy containing at least one as listed above. The thickness of the first metallic layer m1 is set preferably within 0.1 to 1.5 nm and the thickness of the second metallic layer m2 is set preferably within 0.3 to 1 nm.

In FIG. 2B, the surface oxidizing treatment and/or the surface nitriding treatment, which is performed after the formation of the first metallic layer m1 and the second metallic layer m2 on the pinned layer 14, infiltrates the elements of the first metallic layer m1 into the second metallic layer m2 and converts the second metallic layer m2 into the corresponding insulating layer 22. In other words, the surface oxidizing treatment and/or the surface nitriding treatment performs the conversion of the metallic layer into the insulating layer and the formation of the current confined path in the order of nano-meter. Then, the surface oxidizing treatment and/or the surface nitriding treatment will be described in detail.

First of all, in order to infiltrate the elements of the first metallic layer m1 into the second metallic layer m2, migration energy is imparted to the elements. In this point of view, it is desired that the surface oxidizing treatment and/or the surface nitriding treatment utilizes ion irradiation or plasma-gas irradiation, not only by oxygen gas flow or nitrogen gas flow which is employed in natural oxidizing treatment or natural nitriding treatment. In order to realize the conversion of the second metallic layer m2 into the corresponding insulating layer sufficiently, it is also desired that the surface oxidizing treatment and/or the surface nitriding treatment utilizes ion irradiation or plasma-gas irradiation.

(I) In this point of view, it is desired that the surface oxidizing treatment and/or the surface nitriding treatment is performed under the condition that gas such as Ar, Xe, He, Ne or Kr is ionized or rendered plasma and oxygen gas and/or nitrogen gas is flowed in the resultant ionized atmosphere or plasma atmosphere so to be assisted thereby (first method).

In order to realize the energy assist by the ions or the plasma effectively in the oxidizing treatment and/or the nitriding treatment, it is desired that a plurality of steps are conducted as described below.

(II) After the oxidizing treatment and/or the nitriding treatment is performed in the first method, the ion beams of inert gas as described above is irradiated onto the surface of the second metallic layer m2 or the third metallic layer m3, or the plasma made of inert gas as described above is irradiated on the surface of the second metallic layer m2 or the third metallic layer m3 (second method).

In the present method, after the oxidizing treatment and/or the nitriding treatment is performed in the first method, ion beams made of at least one selected from the group consisting of Ar, Xe, He, Ne and Kr are irradiated onto the surface of the second metallic layer m2 or the third metallic layer m3, or a plasma made of at least one selected from the same group as described above is irradiated on the surface of the second metallic layer m2 or the third metallic layer m3. This is applied for the energy assist effect to form the CCP structure. Instead of the inert gas, the ion beams or the plasma may be made of oxygen and/or nitrogen.

According to the present method, the oxidizing treatment and/or the nitriding treatment can be assisted afterward by the means of the irradiation of the ion beams or the contact of the plasma so that an additional migration energy can be applied to the first metallic layer m1, thereby easily forming the current confined path with the corresponding uniform size and characteristic.

(III) Before the oxidizing treatment and/or the nitriding treatment is performed in the first method, the ion beams of inert gas as described above is irradiated onto the surface of the second metallic layer m2 or the third metallic layer m3, or the plasma made of inert gas as described above is irradiated on the surface of the second metallic layer m2 or the third metallic layer m3 (third method).

In the present method, before the oxidizing treatment and/or the nitriding treatment is performed in the first method (I), ion beams made of at least one selected from the group consisting of Ar, Xe, He, Ne and Kr are irradiated onto the surface of the second metallic layer m2 or the third metallic layer m3, or a plasma made of at least one selected from the same group as described above is irradiated on the surface of the second metallic layer m2 or the third metallic layer m3. According to the present method, the additional migration energy can be applied in advance to the first metallic layer m1, and the oxidizing treatment and/or the nitriding treatment can be performed successively to apply the inherent migration energy to the first metallic layer m1. In this case, the current confined path with the corresponding uniform size and characteristic can be easily formed.

(IV) Before and after the oxidizing treatment and/or the nitriding treatment is performed in the first method, the ion beams of inert gas as described above is irradiated onto the surface of the second metallic layer m2 or the third metallic layer m3, or the plasma made of inert gas as described above is irradiated on the surface of the second metallic layer m2 or the third metallic layer m3 (fourth method).

The fourth method is constituted of the combination of the second method (II) and the third method (III)

In the first method, therefore, the ion beam irradiation and/or the plasma irradiation after the oxidizing treatment and/or the nitriding treatment can be performed in the same manner as the second method (II) and the ion beam irradiation and/or the plasma irradiation before the oxidizing treatment and/or the nitriding treatment can be performed in the same manner as the third method (III).

Then, the ion beam irradiation and/or the plasma irradiation, which is to be performed after and/or before the oxidizing treatment and/or the nitriding treatment will be described in detail, hereinafter (second method through fourth method).

In this embodiment, the second current confined path formed through the converting treatment is self-aligned for the first current confined path formed through the converting treatment so as to form the elongated current confined path penetrating through the insulating layer 22. The reason of forming the elongated current confined path may be described as follows. Namely, in the employment of any one of the first method through the fourth method, the first metallic layer m1 is pumped up into the second metallic layer m2 and partially exposed from the second metallic layer m2. Then, when the third metallic layer m3 is formed on the second metallic layer m2 and the subsequent converting treatment is performed for the third metallic layer m3, the first metallic layer m1 is also pumped up into the third metallic layer m3 from the surface of the second metallic layer m2. Therefore, the first metallic layer m1 is subsequently pumped up into the second metallic layer m2 and the third metallic layer m3 through the second metallic layer m2. The pumping up effect of the first metallic layer m1 can be realized by any one of the first method through fourth method relating to the conversion treatment.

In the irradiation of the ion beams, the acceleration voltage "V" is set within +3 to +130V and the beam current "Ib" is set within 20 to 200 mA. The acceleration voltage "V" and the beam current "Ib" are smaller than the ones in ion beam etching. In the contact of the plasma, the formation condition of the plasma can be appropriately controlled, e.g., by means of RF power.

Suppose that the incident angle of the ion beams is set zero when the ion beams are incident onto the second metallic layer m2 in the direction perpendicular to the film surface thereof and that the incident angle of the ion beams is set to 90 degrees when the ion beams are incident onto the second metallic layer m2 in the direction parallel to the film surface, the incident angle of the ion beams may be set preferably within a range of 0 to 80 degrees. The treatment period is set preferably within 15 to 180 seconds, particularly within 30 seconds or over in view of the controllability of the irradiation of the ion beams. Too long treatment period may deteriorate the productivity yield of the magneto-resistance effect element (CCP-CPP element). Therefore, the treatment period is set more preferably within 30 to 180 seconds.

By irradiating the ion beams with the above-ranged energy, the elements of the first metallic layer m1 are pumped up into the second metallic layer m2 so as to form the current confined path.

As mentioned above, the second metallic layer m2 may be made of AlCu or Al. When the second metallic layer m2 is made of Al without Cu, the current confined path is made of the Cu elements of the first metallic layer which are pumped up into the second metallic layer. Of course, the second metallic layer may be made of another metal such as Si, Hf, Zr, Ti, Mg, Cr, Mo, Nb or W which can be converted into the corresponding stable oxide, instead of Al.

In the oxidizing treatment using the irradiation of the ion beams (one step in the first method through fourth method), the acceleration voltage "V" may be set preferably within +40V to +200V and the ion beam current "Ib" may be set preferably within 3 to 300 mA. The oxidizing treatment period may be set preferably within 15 to 300 seconds, more preferably within 20 to 180 seconds. The oxidizing treatment period is shortened when the ion beams with higher energy are employed, and elongated when the ion beams with lower energy are employed. In the oxidizing treatment using the contact of the plasma, the similar conditions to the ones in the irradiation of the ion beams can be employed.

The preferable range of the oxygen exposure in the oxidizing treatment may be set within 1000 to 5000 L ($1 L=1\times10^{-6}$ Torr×sec) in the irradiation of the ion beams or the contact of the plasma and within 3000 to 30000 L in the natural oxidation.

If the oxidizing treatment is performed under the above-described condition in one or some steps in FIG. 2, the ideal CCP structure can be easily formed.

In FIG. 2D, the third metallic layer m3 and the fourth metallic layer m4 may be made of the same materials as the second metallic layer m2 and the first metallic layer m1, respectively. Or the third metallic layer m3 and the fourth metallic layer m4 may be made of different materials from the second metallic layer m2 and the first metallic layer m1, respectively. In a preferred embodiment, the former case is employed (that is, the third metallic layer m3 and the fourth metallic layer m4 may be made of the same materials as the second metallic layer m2 and the first metallic layer m1, respectively.) Concretely, the fourth metallic layer m4 is made of a metallic layer containing at least one of Cu, Au, Ag, Al. The third metallic layer m3 is made of a metallic material containing at least one of Al, Si, Mg, Ti, Hf, Zr, Cr, Mo, Nb, W which can exhibit sufficient insulation through the oxidizing treatment or nitriding treatment. The fourth metallic layer m4 and the third metallic layer m3 may be made of a single element selected from the metals listed above or an alloy containing at least one from the metals listed above.

The thickness of the third metallic layer m3 is set preferably within 0.1 to 1.5 nm, and the thickness of the fourth metallic layer m4 is set preferably within 0.3 to 1 nm.

In this embodiment, the conditions of the oxidizing treatment are described in detail, but the conditions of the nitriding treatment can be determined in the same manner as the oxidizing treatment.

In FIG. 2G, the top metallic layer 17 and the free layer 18 are formed. The top metallic layer 17 may be made of the same material as the CCP structure or a different material from the CCP structure. In a preferred embodiment, the top metallic layer is made of Cu, Au, Ag, Al. The thickness of the top metallic layer 17 is set preferably within 0 to 1 nm.

Figure 3:
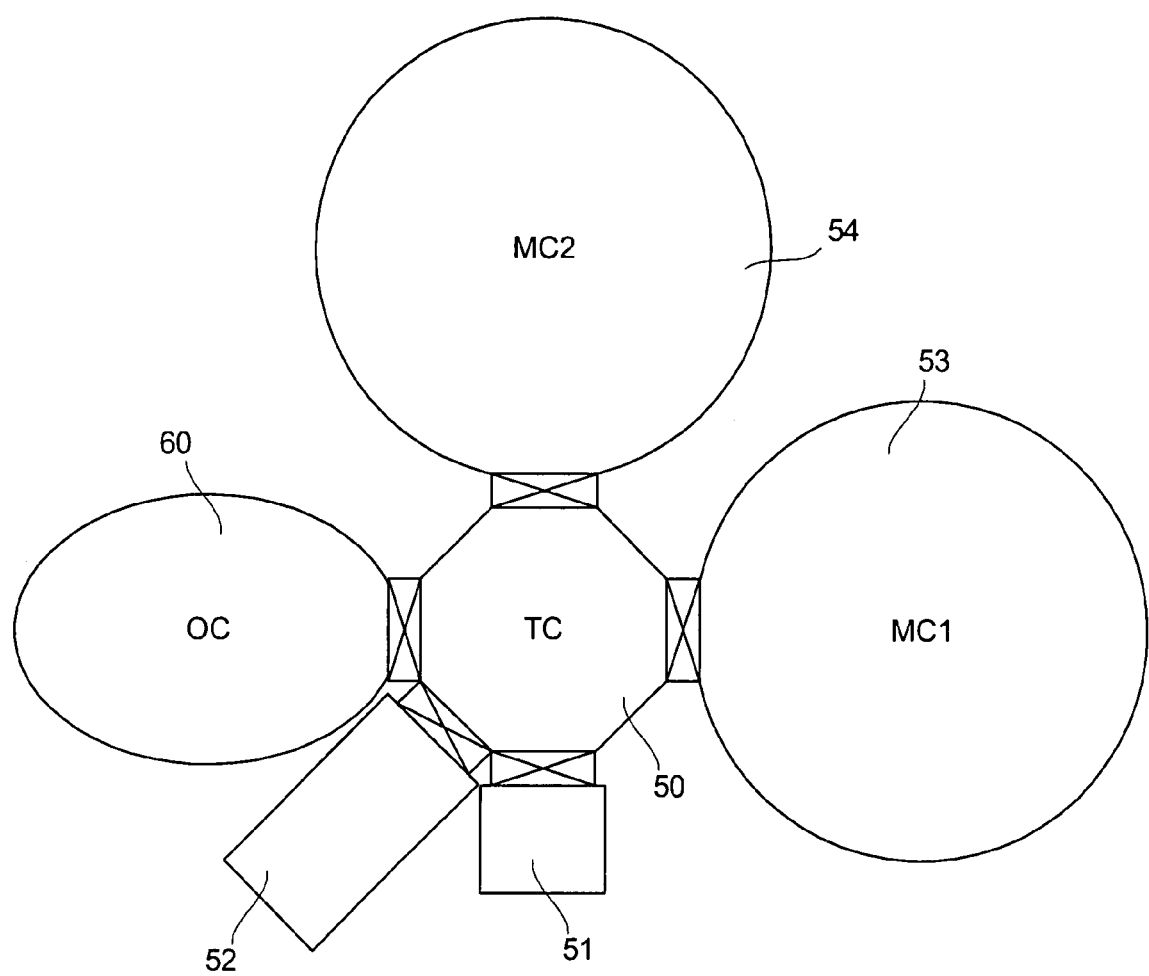
FIG. 3 is a schematic view illustrating a film forming apparatus for manufacturing the magneto-resistance effect element in the embodiment.

FIG. 3 is a schematic view illustrating a film forming apparatus for manufacturing a magneto-resistance effect element (CCP-CPP element) in this embodiment. As shown in FIG. 3, the transfer chamber (TC) 50 is disposed at the center of the apparatus such that the load lock chamber 51, the pre-cleaning chamber 52, the first metallic film-forming chamber (MC1) 53, the second metallic film-forming chamber (MC2) 54 and the oxidizing chamber (OC) 60 are disposed so as to be connected with the transfer chamber 50 via the gate valves, respectively. In the apparatus, the substrate on which various films are to be formed is transferred from one chamber from another chamber under the vacuum condition via the corresponding gate valve. Therefore, the surface of the substrate can be maintained clean.

The metallic film-forming chambers 53 and 54 include a plurality of targets (five to ten targets) which is called as a multi-structured target. As the film forming means, a sputtering method such as a DC magnetron sputtering or an RF magnetron sputtering, an ion beam sputtering, a vacuum deposition, a CVD (Chemical Vapor Deposition) or an MBE (Molecular Beam Epitaxy) can be employed.

The surface oxidizing treatment can be performed in a chamber with the ion beam mechanism, the RF plasma mechanism or the heating mechanism. It is required that the chamber to be employed for the surface oxidizing treatment is separated from the chamber to be employed for the metallic film forming chamber.

The typical pressure in each chamber of the apparatus is set in the order of $10^{-9}$ Torr. However, the allowable pressure range is $5 \times 10^{-8}$ Torr or below.

The metallic layers m1, m2, m3 and m4 are formed in the metallic film-forming chamber 53 and/or the second metallic film-forming chamber 54. The surface oxidizing treatment is performed in the oxidizing chamber 60. After the metallic layers m1 and m2 are formed, the wafer under process is transferred into the oxidizing chamber 60 via the transfer chamber 50, and then, the oxidizing treatment is performed. Thereafter, the wafer is transferred into the metallic film-forming chamber 53 or 54, and then, the metallic layers m3 and m4 are formed. Thereafter, the wafer is transferred again into the oxidizing chamber 60 via the transfer chamber 50, and then, the oxidizing treatment is performed. Thereafter, the wafer is transferred into the metallic film-forming chamber 53 or 54, and then, the top metallic layer 17 and the free layer 18 are formed.

Figure 4:
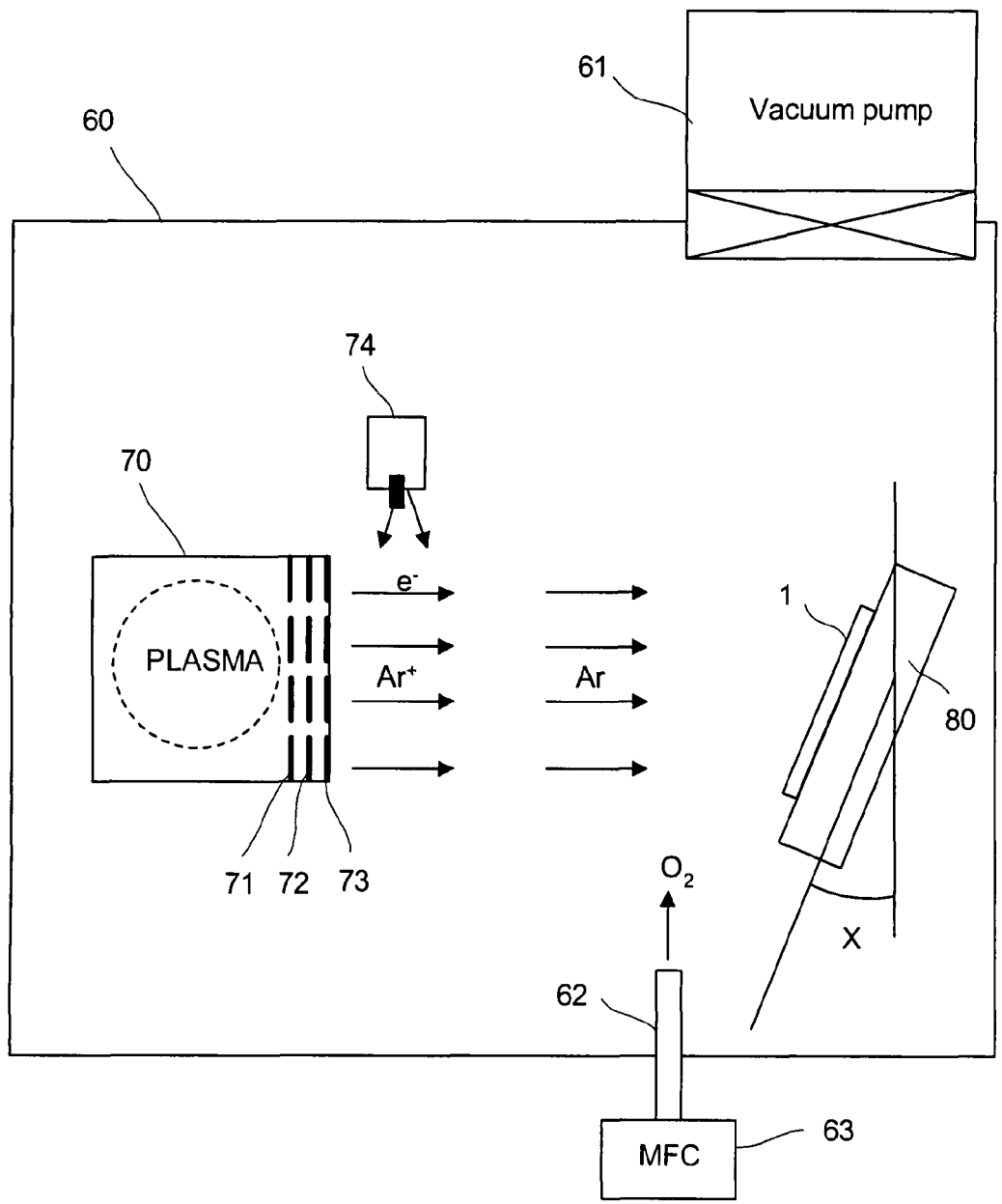
FIG. 4 is a structural view of the oxidizing chamber of the apparatus illustrated in FIG. 3.
Figure 5A:
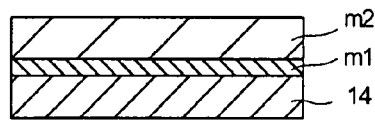
FIG. 5 relates to views illustrating another forming process of the spacer of the magneto-resistance effect element in the embodiment.
Figure 5B:
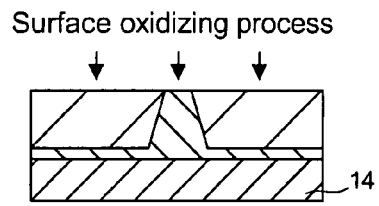
Figure 5C:
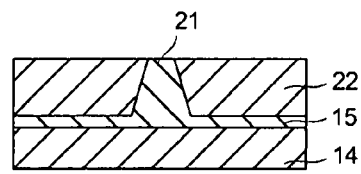
Figure 5D:
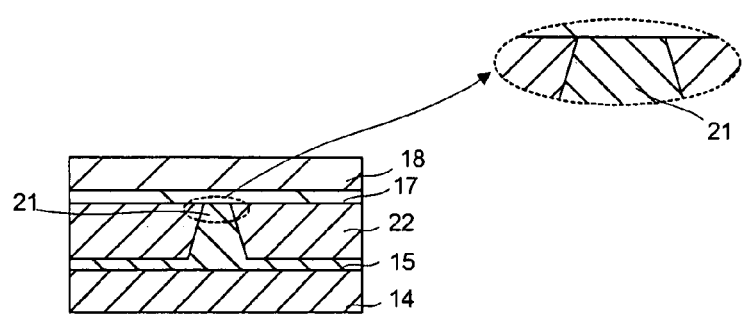

FIG. 4 relates to an embodiment of the oxidizing chamber 60 in FIG. 3. In this embodiment, the oxidizing chamber 60 is configured so as to perform the irradiation of the ion beams. As shown in FIG. 4, the interior of the oxidizing chamber 60 is evacuated in vacuum by means of the vacuum pump 61 and oxygen gas is introduced into the oxidizing chamber 60 via the oxygen supplying tube 62 under the condition the flow rate of the oxygen gas is controlled by means of the mass flow controller (MFC) 63. Then, the ion source 70 is provided in the oxidizing chamber 60. The ion source 70 may be an ICP (Inductive coupled plasma) type, a Capacitive coupled plasma type, an ECR (Electron-cyclotron resonance) type or Kauffmann type. The substrate holder 80 and the substrate 1 are provided opposite to the ion source 70.

In the ion source 70, the three grids 71, 72 and 73 are provided at the ion discharging hole so as to control the acceleration of the ion beams. Then, the neutralizer 74 is provided outside of the ion source 70. The substrate holder 80 is supported under the condition that the substrate holder 80 can be inclined against the inner wall of the oxidizing chamber 60. The incident angle of the ion beams onto the substrate 1 can be varied widely, but the typical incident angle may be set within 15 to 60 degrees.

In the oxidizing chamber 60, by irradiating the ion beams of Ar or the like onto the substrate 1, the surface oxidizing treatment can be assisted by the energy of the ion beams. In this case, since the ion beams are irradiated onto the substrate 1 while the oxygen gas is supplied into the oxidizing chamber 60, the metallic layer (second metallic layer m2 or third metallic layer m3) can be converted into the corresponding insulating layer.

In this embodiment, the oxidizing chamber 60 is configured so as to perform the irradiation of the ion beams, but may be configured so as to perform the contact of the RF plasma.

Anyway, it is desired that the surface oxidizing treatment is performed in the chamber with the irradiation mechanism of the ion beams or the contact mechanism of the plasma under the application of the energy originated from the ion beams or the plasma.

The oxidizing treatment can be performed under the thermal energy. In this case, the wafer is thermally treated within a temperature range of 100 to 300° C. during the period of several ten seconds through several minutes. The thermal treatment can be incorporated into the oxidizing treatment.
(Schematic Explanation of the Method for Manufacturing a Magneto-Resistance Effect Element)

Hereinafter, the method for manufacturing a magneto-resistance effect element will be schematically described. First of all, on the substrate (not shown) are subsequently formed the bottom electrode 11, the underlayer 12, the pinning layer 13, the pinned layer 14, the bottom metallic layer 15, the spacer layer 16, the top metallic layer 17, the free layer 18, the cap layer 19 and the top electrode 20.

A substrate is set into the load lock chamber 51 so that the metallic layers are formed in the metallic film-forming chambers 53 and/or 54 and the oxidizing treatment (nitriding treatment) is performed in the oxidizing chamber 60. The ultimate vacuum of the metallic film-forming chambers 53 and 54 is preferably set to $1 \times 10^{-8}$ Torr or below, normally within a range of $5 \times 10^{-10}$ Torr-$5 \times 10^{-9}$ Torr. The ultimate vacuum of the transfer chamber 50 is set in the order of $10^{-9}$ Torr. The ultimate vacuum of the oxidizing chamber 60 is set to $8 \times 10^{-8}$ Torr or below.

(1) Formation of Underlayer 12

The bottom electrode 11 is formed on the (not shown) substrate by means of micro-process in advance. Then, the underlayer 12 is formed as a layer of Ta 5 nm/Ru 2 nm on the bottom electrode 11. The Ta layer functions as the buffer layer 12a for relaxing the surface roughness of the bottom electrode 11. The Ru layer functions as the seed layer 12b for controlling the crystalline orientation and the crystal grain of the spin valve film to be formed thereon.

(2) Formation of Pinning Layer 13

Then, the pinning layer 13 is formed on the underlayer 12. The pinning layer 13 may be made of an antiferromagnetic material such as PtMn, PdPtMn, IrMn, RuRhMn.

(3) Formation of Pinned Layer 14

Then, the pinned layer 14 is formed on the pinning layer 13. The pinned layer 14 may be formed as the synthetic pinned layer of the bottom pinned layer 141 ($Co_{90}Fe_{10}$)/the magnetic coupling layer 142 (Ru)/the top pinned layer 143 ($Co_{90}Fe_{10}$).

(4) Formation of Spacer 16

Then, the spacer layer 16 with the CCP structure is formed. Since the formation of the spacer layer 16 is characterized by this embodiment, the formation process of the spacer layer 16 will be described in detail.

Prior to the formation of the spacer layer 16, the underlayer 12 through the pinned layer 14 are formed on the wafer in the metallic film-forming chambers 53 and/or 54. The wafer is transferred into the oxidizing chamber 60 for the oxidizing treatment.

The spacer layer 16 is preferably formed thick because the insulating layer of the spacer layer 16 can exhibit the inherent function of insulating the current confined path of the spacer layer 16 so as to prevent the leak current from the current confined path. In this case, the CPP effect can be enhanced so that the reliability of the intended magneto-resistance effect element can be enhanced. If the insulating layer of the spacer layer 16 is formed thick, the dielectric break voltage of the insulating layer can be increased and dielectric break-down voltage originated from ESD (Electric Static Discharge) can be improved. The better ESD robustness leads to the improvement of the productivity yield in the incorporation of the magnetic head with the magneto-resistance effect element (CCP-CPP element) in this embodiment into the corresponding HDD.

Since the higher reliability of the magneto-resistance effect element (CCP-CPP element) can enhance the break-resistance under any condition and the thermal resistance, the magneto-resistance effect element can be applied for a server or an enterprise requiring high reliability, in addition to the incorporation into the HDD. The magnetic head with high reliability in addition to high density recording becomes important recently because the HDD is widely available. Therefore, the lifetime of the magnetic head can be elongated due to the high reliability of the magneto-resistance effect element to be incorporated in the magnetic head so that the technically available field of the HDD can be enlarged. In this point of view, the magnetic head can be applied for a car navigation system requiring a severe thermal use condition.

Of course, the magnetic head with high reliability can be applied for a personal computer, a portable music player, a cellular phone and the like in addition to the HDD as described above.

Although it is desired that the spacer layer is formed thick as described above, it is difficult to form the thick spacer layer. Conventionally, the spacer layer 16 is formed in accordance with the document, JP-A2006-54257KOKAI, for example. However, the spacer layer can not be formed thick on the technique disclosed in the document. In view of the pumping up of the elements of the first metallic layer m1 into the second metallic layer m2, it is apparent that the thick spacer layer prevents the function of the pumping up because the energy relating to the pumping up from the ion beams or the plasma can not be conducted up to the bottom portion of the spacer layer.

In contrast, if the energy of the ion beams or the plasma is increased so as to apply the large energy relating to the pumping up to the spacer layer, the second metallic layer m2 may be etched and grind down and the elements of the first metallic layer m1 may not be pumped up into the second metallic layer m2. In an extreme case, the metallic layers m1 and m2 may be etched and thus, diminished. In this case, the oxidizing treatment assist by the energy originated from the ion beams or the plasma can not function inherently.

As a result, it is difficult that the spacer layer 16 is formed thick in accordance with the conventional technique as disclosed in the document.

On the other hand, it is easy to form the spacer layer thin, but the thin spacer layer 16 can not exhibit the sufficient CPP effect. For example, the current in the current confined path of the spacer layer may be leaked as a tunnel current through the insulating layer of the spacer layer. Moreover, the thin insulating layer leads to the reduction in dielectric break-resistance, and thus, the reduction in ESD robustness. Therefore, various devices are required in the formation of the spacer layer and the productivity yield of spacer layer may be deteriorated.

In this point of view, the magnetic head with the magneto-resistance effect element (spacer layer) manufactured by the conventional technique as described above is available in some technical field, but not available in a technical field requiring high reliability.

If the manufacturing method in the present invention is employed, the spacer layer can be formed thick so that the insulating layer of the spacer layer can be formed thick. In this case, the leak current from the current confined path through the insulating layer can be prevented so that the spacer layer can exhibit the inherent CPP effect as designed and the high reliability. The thick insulating layer of the spacer layer can enhance the dielectric break voltage, that is, the dielectric break resistance originated from ESD (Electric Static Discharge).

In this embodiment, the spacer layer 16 may be formed in accordance with the steps as shown in FIG. 1. Herein, an embodiment relating to the formation of the spacer layer 16 will be described. In this embodiment, the spacer layer 16 is composed of the insulating layer 161 made of amorphous $Al_2O_3$ and a current confined path 162 made of crystalline Cu.

First of all, the metallic layer m1 (e.g., made of Cu) as a supplier for the current confined path is formed on the top pinned layer 143, and the metallic layer m2 (e.g., AlCu or Cu) to be converted into the corresponding insulating layer is formed on the metallic layer m1.

Then, the converting treatment is performed onto the metallic layer m2 by means of the oxidizing treatment or the nitriding treatment as described above. The converting treatment can be performed through a plurality of steps. For example, in the first step, ion beams of inert gas such as Ar are irradiated onto the metallic layer m2. The irradiation of ion beams corresponds to a pre-treatment for the formation the insulating layer 161 and the current confined path 162, and is called as a "PIT (Pre-ion treatment)". According to the PIT, the elements of the bottom layer (metallic layer m1) is pumped up and infiltrated into the top layer (metallic layer m2). Therefore, the PIT is effective as an energy treatment.

The migration energy of the elements as described above can be generated by means of thermal treatment, e.g., within a temperature range of 100 to 300° C. Moreover, after the metallic layer m2 is converted into the corresponding insulating layer, the energy treatment can be performed onto the insulating layer by the means of the irradiation of the ion beams of inert gas such as Ar. The energy treatment is called as an "AIT (After-ion treatment) because the ion beam treatment is carried out after the oxidation.

According to the energy treatment, the elements (e.g., Cu elements) of the first metallic layer m1 are pumped up and infiltrated into the second metallic layer m2 (e.g., AlCu layer).

In the PIT process and AIT process, for example, the Ar ion beams are irradiated under the condition that the acceleration voltage is set within 30 to 150V, the beam current is set within 20 to 200 mA and the treatment period of time is set within 30 to 180 seconds. The acceleration voltage is preferably set within 40 to 60V. If the acceleration voltage is set beyond the above-described range, the PIT process or the AIT process may induce the surface roughness for the assembly under fabrication, thereby deteriorating the MR ratio. The beam current is preferably set within 30 to 80 mA and the treatment period of time is preferably set within 60 to 150 seconds.

The spacer layer 16 composed of the insulating layer and the current confined path can be formed by means of biasing sputtering, instead of the PIT process or the AIT process. With the DC biasing, the energy of the biasing sputtering is configured such that the DC biasing voltage is set within 30 to 200V. With the RF biasing, the energy of the biasing sputtering is configured such that the RF biasing power is set within 30 to 200 W.

In the IAO process, for example, the Ar ion beams are irradiated under the condition that the acceleration voltage is set within 40 to 200V, the beam current is set within 30 to 200 mA and the treatment period of time is set within 15 to 300 seconds while the oxygen gas is supplied. The acceleration voltage is preferably set within 50 to 100V. If the acceleration voltage is set beyond the above-described range, the IAO process may induce the surface roughness for the assembly under fabrication, thereby deteriorating the MR ratio. The beam current is preferably set within 40 to 100 mA and the treatment period of time is preferably set within 30 to 180 seconds.

In the IAO process, the amount of oxygen is set preferably within 1000 to 3000 L (Langmuir) because it is not desired that the bottom magnetic layer (pinned layer 14) is oxidized in addition to the metallic layer m2, which leads to the deterioration of the thermal resistance and reliability of the CCP-CPP element. In view of the enhancement of the reliability of the CCP-CPP element, it is important that the magnetic layer (pinned layer 14) under the spacer layer 16 is not oxidized so as to maintain the metallic property thereof. In this point of view, the amount of oxygen to be supplied is preferably set within the above-described range.

In order to form the stable oxide by supplying the oxygen, it is desired that the oxygen is supplied only while the ion beams are irradiated onto the assembly under fabrication. In other words, it is desired that the oxygen is not supplied while the ion beams are not irradiated.

According to the above-described process, the spacer layer 16 is partially formed so as to include the insulating layer 161 made of, e.g., $Al_2O_3$ and the current confined path 162 made of, e.g., Cu. Since elemental Al is likely to be oxidized and elemental Cu is unlikely to be oxidized, in the process, the difference in oxide formation energy between the elemental Al and the elemental Cu.

The above-described process is originated from the document, JP-A 2006-54257 KOKAI. In this embodiment, however, in order to form the ideal CCP structure, the metallic layers m1 and m2 are formed thin. In this case, the CCP structure can be formed under good condition as designed.

Concretely, the thickness of the metallic layer m1 is set preferably within 0.1 to 1.5 nm and the thickness of the metallic layer m2 is set preferably within 0.3 to 1 nm.

The first metallic layer m1 to constitute the current confined path may be made of another material such as Au, Ag, Cu or an alloy containing at least one of the listed metals. However, it is desired that the first metallic layer m1 is made of Cu because the resultant Cu current confined path 162 can exhibit a larger thermal stability against a given thermal treatment in comparison with an Au, Ag or Al current confined path. The first metallic layer m1 may be made of a magnetic material such as Co, Fe, Ni or an alloy thereof, instead of the non-magnetic material as listed above.

If the second metallic layer m2 is made of $Al_{90}Cu_{10}$, the elemental Cu is segregated from the elemental Al while the elemental Cu of the first metallic layer m1 is pumped up in the PIT process. Namely, the current confined path 162 is formed by the first and second metallic layers. If the ion beam-assisted oxidation is carried out after the PIT process, the separation between the elemental Al and the elemental Cu is developed and then, the oxidation for the elemental Al is developed.

The second metallic layer m2 may be made of Al, not $Al_{90}Cu_{10}$. In this case, the second metallic layer m2 does not contain elemental Cu constituting the current confined path 162. Therefore, the current confined path 162 is made of the elemental Cu of the first metallic layer m1. As described above, if the second metallic layer m2 is made of AlCu, the current confined path 162 is also made of the elemental Cu of the second metallic layer m2. In the latter case, if the insulating layer 161 (spacer layer 16) is formed thick, the current confined path 162 can be formed easily. In the former case, the elemental Cu of the first metallic layer m1 is unlikely to be infiltrated into the insulating layer 161 ($Al_2O_3$ layer) formed through the oxidation as described above, but the dielectric break voltage of the insulating layer 161 can be developed. In this way, the Al metallic layer m2 or the AlCu metallic layer m2 can exhibit the corresponding advantage and disadvantage as described above, and thus, may be employed as usage in view of the advantage and disadvantage.

The thickness of the second metallic layer m2 made of AlCu or Al is set preferably within 0.3 to 1 nm. The thickness range of the second metallic layer m2 includes too small thickness range to form the spacer layer 16 not capable of exhibiting sufficient CPP effect. For example, if the second metallic layer m2 is formed as an Al layer with a thickness of 0.3 nm, the spacer layer 16 is formed too thin to exhibit the CPP effect. As described below, however, another process is performed to complete the spacer layer. In other words, the above-described process contributes only to the formation of a part (the bottom portion) of the spacer layer 16. Therefore, the range of the small thickness of the second metallic layer m2 becomes desirable.

The AlCu of the second metallic layer m2 can be preferably represented by the composition formula of $Al_xCu_{100-X}$ (X=100–70%). The third additive element such as Ti, Hf, Zr, Nb, Mg, Mo or Si may be added to the AlCu of the second metallic layer m2. The content of the third additive element may be preferably set within 2 to 30%. The third additive element may make the formation of the CPP structure easy. If the rich amount of the third additive element is distributed at the interface between the insulating layer 161 made of $Al_2O_3$ and the current confined path 162 made of Cu, the adhesion between the insulating layer 161 and the current confined path 162 may be increased so as to enhance the electro-migration resistance.

In the CCP-CPP element, the current density in the current confined path 162 of the spacer layer 16 is increased remarkably within a range of $10^7$ to $10^{10}$ A/cm$^2$. Therefore, the large electron-migration resistance and the high stability are required for the spacer layer 16 due to the large current density. However, if the ideal CPP structure is formed as designed, the large electron-migration robustness can be realized without the addition of the third additive element.

The second metallic layer m2 may be made of another alloy mainly composed of Hf, Mg, Zr, Ti, Ta, Mo, W, Nb or Si, instead of the Al alloy to form the $Al_2O_3$ insulating layer. The insulating layer 161 may be made of a nitride or an oxynitride instead of an oxide such as $Al_2O_3$.

Irrespective of the kind of material of the second metallic layer m2, the thickness of the second metallic layer m2 is set preferably within 0.5 to 2 nm so that the thickness of the insulating layer formed through the conversion by means of oxidizing treatment, nitriding treatment or oxynitriding treatment can be set within 0.8 to 3.5 nm.

The insulating layer 161 may be made of an oxide, a nitride or an oxynitride formed by oxidizing, nitriding or oxynitriding an alloy. For example, the insulating layer 161 may be made of an oxide composed of an $Al_2O_3$ matrix and an additional element such as Ti, Mg, Zr, Ta, Mo, W, Nb or Si added into the $Al_2O_3$ matrix or an oxide composed of Al and other metals by an amount of 0 to 50%.

The thickness of the third metallic layer m3 is set preferably within 0.3 to 1.0 nm and the thickness of the fourth metallic layer m4 is set preferably within 0.1 to 1.5 nm. The conversion treatment is performed for the metallic layers m3 and m4 in the same manner as described above. The third metallic layer m3 may be made of AlCu or Al, and the fourth metallic layer m4 may be made of Cu.

In this embodiment, the conversion treatment is performed for the combination of the first metallic layer m1 and the second metallic layer m2 and the combination of the third metallic layer m3 and the fourth metallic layer m4. Namely, the conversion treatment is performed by two steps. Therefore, the spacer layer 16 can be formed thick and thus, the CPP structure can be formed thick.

Instead of the conversion treatment of two steps, the conversion treatment of three or more steps may be employed so as to form the CPP-type spacer layer. In the present CPP-type magneto-resistance effect element, however, the intended CPP-type spacer layer can be formed by the conversion treatment of two steps.

(5) Formation of Top Metallic Layer 17 and Free Layer 18

The top metallic layer 17 is formed as a Cu layer with a thickness of 0.25 nm on the spacer layer 16. The preferable thickness of the top metallic layer 17 is within a range of 0.2 to 1.0 nm. If the top metallic layer 17 is formed in a thickness of 0.25 nm, the crystallinity of the free layer 18 can be enhanced easily. However, the top metallic layer 17 may not be formed.

The free layer 18 is formed as a $Co_{90}Fe_{10}$ 1 nm/$Ni_{83}Fe_{17}$ 3.5 nm on the top metallic layer 17. In order to realize the higher MR ratio of the magneto-resistance effect element, the appropriate material selection for the free layer 18 in the vicinity of the spacer 16 should be considered. In this point of view, it is desired to form the NiFe alloy film or the CoFe alloy film at the interface between the free layer 18 and the spacer layer 16. The CoFe alloy film is more preferable than the NiFe alloy film. As the CoFe alloy film, the $Co_{90}Fe_{10}$ layer with a thickness of 1 nm can be exemplified. Of course, the CoFe alloy layer can contain another composition.

If the CoFe alloy layer with a composition almost equal to the one of the $Co_{90}Fe_{10}$ layer is employed, the thickness of the CoFe alloy layer is preferably set within 0.5 to 4 nm. If the CoFe alloy layer with a composition (e.g., $CO_{50}Fe_{50}$) different from the one of the $Co_{90}Fe_{10}$ layer is employed, the thickness of the CoFe alloy layer is preferably set within 0.5 to 2 nm. If the free layer 18 is made of $Fe_{50}CO_{50}$ (or $Fe_xCo_{1-X}$ (X=45 to 85)) in view of the enhancement in spin dependent interface scattering effect, it is difficult to set the thickness of the free layer 18 as thick as the pinned layer 14 so as to maintain the soft magnetism of the free layer 18. In this case, therefore, the thickness of the free layer 18 is preferably set within 0.5 to 1 nm. If the free layer 18 is made of Fe or Fe alloy without Co, the thickness of the free layer 18 may be increased within 0.5 to 4 nm because the soft magnetism of the free layer can be maintained under good condition.

The NiFe alloy layer can maintain stably the inherent soft magnetism, but the CoFe alloy layer can not maintain stably inherent soft magnetism in comparison with the NiFe alloy layer. In this case, if the NiFe alloy layer is formed on the CoFe alloy layer, the soft magnetism of the CoFe alloy can be compensated with the soft magnetism of the NiFe alloy layer. In this point of view, the formation of the NiFe alloy layer at the interface between the free layer 18 and the spacer layer 16 can develop the MR ratio of the spin valve film, that is, the magneto-resistance effect element.

The composition of the NiFe alloy layer is preferably set to $Ni_xFe_{100-X}$ (X=75 to 85%). Particularly, the composition of the NiFe alloy layer is preferably set to a Ni-rich composition in comparison with the normal composition of $Ni_{81}Fe_{19}$ (e.g., $Ni_{83}Fe_{17}$) so as to realize the non-magnetostriction of the NiFe layer. The magnetostriction of the NiFe alloy layer is shifted positive when the NiFe alloy layer is formed on the CCP-structured spacer 16 in comparison with the magnetostriction of the NiFe alloy layer when the NiFe alloy layer is formed on a Cu spacer. In this point of view, the composition of the NiFe alloy layer is shifted to a Ni-rich composition in advance so as to cancel the positive magnetostriction of the NiFe alloy layer formed on the spacer layer 16 because the Ni-rich NiFe alloy layer can exhibit the negative magnetostriction.

The thickness of the NiFe layer may be set preferably within 2 to 5 nm (e.g., 3.5 nm). Without the NiFe layer, a plurality of CoFe layers or Fe layers with a thickness of 1 to 2 nm and a plurality of thinner Cu layers with a thickness of 0.1 to 0.8 nm are alternately stacked one another, thereby forming the free layer 18.

(6) Formation of Cap Layer 19 and Top Electrode 20

The cap layer 19 is formed as a multilayer of Cu 1 nm/Ru 10 nm on the free layer 18. Then, the top electrode 20 is formed on the cap layer 19 so as to flow a current to the spin valve film in the direction perpendicular to the film surface thereof.

EXAMPLES

The present invention will be described in detail in view of Examples.

Example 1

| Bottom electrode 11 | |
| --- | --- |
| Underlayer 12: | Ta 3 nm/Ru 2 nm |
| Pinning layer 13: | $Ir_{22}Mn_{78}$ 7 nm |
| Pinned layer 14: | $Co_{90}Fe_{10}$ 3.6 nm/Ru 0.9 nm/($Fe_{50}Co_{50}$ 1 nm/Cu 0.25 nm) × 2/$Fe_{50}Co_{50}$ 1 nm |
| Metallic layer 15: | Cu 0.1 nm |
| Spacer layer (CCP-NOL) 16: | Insulating layer 161 of $Al_2O_3$ and current confined path 162 of Cu |
| Metallic layer 17: | Cu 0.25 nm |
| Free layer 18: | $Co_{90}Fe_{10}$ 1 nm/$Ni_{83}Fe_{17}$ 3.5 nm |
| Cap layer 19: | Cu 1 nm/Ru 10 nm |
| Top electrode 20 | |

The manufacturing process of the spacer layer (CCP-NOL) 16 will be described. The manufacturing processes of other layers can be conducted by means of conventional techniques and thus, will be omitted.

First of all, the first metallic layer m1 was formed as a Cu layer with a thickness of 0.3 nm, and the second metallic layer m2 was formed as an AlCu layer with a thickness of 0.6 nm as shown in FIG. 2A.

Then, the first conversion treatment was performed as shown in FIG. 2B. Concretely, the conversion treatment was performed as described below. First of all, the Ar ion beams were irradiated onto the surface of the assembly under fabrication while the oxygen gas was flowed in the oxidizing chamber. The energy of the Ar ion beams was set to 60V (IAO). Thereafter, the flow of the oxygen gas was stopped and the irradiation of the Ar ion beams was continued under the same condition as described above for 60 seconds (AIT). As a result, the assembly can be formed as shown in FIG. 2C.

Then, as shown in FIG. 2D, the third metallic layer m3 was formed as a Cu layer with a thickness of 0.3 nm and the fourth metallic layer was formed as an AlCu layer with a thickness of 0.6 nm.

Then, the second conversion treatment was performed as shown in FIG. 2E. Concretely, the conversion treatment was performed as described below. First of all, the Ar ion beams were irradiated onto the surface of the assembly under fabrication while the oxygen gas was flowed in the oxidizing chamber. The energy of the Ar ion beams was set to 60V (IAO). Thereafter, the flow of the oxygen gas was stopped and the irradiation of the Ar ion beams was continued under the same condition as described above for 60 seconds (AIT). As a result, the assembly can be formed as shown in FIG. 2F.

Then, as shown in FIG. 2G, the top metallic layer 17 was formed in a thickness of 0.25 nm, thereby completing the spacer layers 15, 16 and 17.

The assemblies in FIGS. 2A to 2G are illustrated, assumed that the final thermal treatment was performed. Therefore, the real assembly in each step may be different from the one illustrated in any one of FIGS. 2A to 2G. The illustrated assembly can be formed by the energy assist of the thermal treatment. The thermal treatment may be performed at a temperature of 290° C. for four hours.

After the spacer layer was formed, the assembly was taken out of the oxidizing chamber 60 and transferred into the metal film-forming chamber so as to form the free layer.

(Evaluation of Example)

Example 1 was evaluated in combination with Comparative Example. In Comparative Example, the intended magneto-resistance effect element (spacer layer) was formed in accordance with the process as shown in FIG. 5. The metallic layer m1 was formed as a Cu layer with a thickness of 0.6 nm, and the metallic layer m2 was formed as an AlCu layer with a thickness of 1.2 nm. The metallic layer m1 in Comparative Example corresponds to the metallic layers m1 and m3 in Example 1, and the metallic layer m2 in Comparative Example corresponds to the metallic layers m2 and m4 in Example 1.

The conversion process was performed once in the same manner as Example 1. Namely, the spacer layer was formed by means of IAO/AIT process.

In this evaluation, the current was flowed from the pinned layer 14 to the free layer 18. The electrons were flowed in the reverse direction, that is, from the free layer 18 to the pinned layer 14. The current flow from the pinned layer 14 to the free layer 18 can reduced the spin transfer noise. It is said that when the current is flowed to the pinned layer 14 from the free layer 18 (the electrons are flowed to the free layer 18 to the pinned layer 14), the spin transfer noise of the magneto-resistance effect element is increased due to the spin transfer torque effect. In this point of view, in this evaluation, the current is flowed from the pinned layer 14 to the free layer 18.

As a result, in Example, the element resistance RA was 500 mΩμm² and the MR ratio was 9%. In Comparative Example, on the other hand, the element resistance RA was 900 mΩμm² and the MR ratio was 7%. The element resistance RA and the MR ratio in Example are different from the ones in Comparative Example even though the thickness of the spacer layer in Example 1 is equal to the one in Comparative Example.

In order to investigate the difference in element resistance and MR variation degree between Example 1 and Comparative Example, a three-dimensional atom probe was employed. The three-dimensional atom probe is classified into destructive testing method where a sample is processed in needle shape and the elements of the sample are evaporated one by one from the top of the sample by applying a high voltage to the sample set in a vacuum chamber.

As a result, in Comparative Example, it was confirmed that the top opening surface of the current confined path 21 becomes small and the content of oxygen at the top of the current confined path 21 becomes larger than the one at the bottom of the current confined path 21. In some cases, the top opening surface of the current confined path 21 is larger than the bottom opening surface of the current confined path 21 by 20% or over. The bottom of the current confined path is defined as less than 50 and the top of the current confined path is defined as 50 or over, assumed that the portion in the side of the substrate of the current confined path is defined as zero and the portion in the side of the surface of the current confined path is defined as 100.

In Comparative Example, the Cu purity at the top of the current confined path 21 is different from the one at the bottom of the current confined path 21. In some cases, the content of oxygen at the top of the current confined path 21 is larger than the one at the bottom of the current confined path 21 by 10 atomic % or over. The lower Cu purity of the current confined path 21 may reduce the CCP effect, thereby deteriorating the performance of the magneto-resistance effect element (CCP-CPP element). The vertically asymmetrical current confined path 21 may deteriorate the reliability of the magneto-resistance effect element in accordance with the direction of the current to be flowed.

In Example 1, on the other hand, the current confined path 162 is formed uniformly in the vertical direction without the difference in opening surface between the top and the bottom of the current confined path 162. Also, the content of oxygen at the top of the current confined path 21 is not larger than the one at the bottom of the current confined path 21 by 10 atomic %.

The cause of the difference between the current confined paths in Example 1 and Comparative Example is originated from that in Comparative Example, the Cu elements of the metallic layer m1 are not sufficiently pumped up into the metallic layer m2 through the oxidizing treatment for the metallic layer m2 because the metallic layer m2 is formed thick. Since the oxidizing treatment is performed onto the surface of the metallic layer m2, the content of oxygen at the top of the current confined path 21 becomes larger than the one at the bottom of the current confined path 21 because the metallic layer m2 is formed thick.

The diameter of the current confined path 162 penetrating through the insulating layer 161 is within 1 to 10 nm and in some cases, within 2 to 6 nm. If the diameter of the current confined path 162 becomes beyond 10 nm, the characteristics of the resultant magneto-resistance effect elements may be fluctuated when the magneto-resistance effect elements are downsized. In this point of view, the diameter of the current confined path 162 is set preferably to 6 nm or below.

Example 2

In Example 1, the CPP type magneto-resistance effect element with the bottom type spin valve film was described. In Example 2, a CPP type magneto-resistance effect element with a top type spin valve film will be described. In the top type spin valve film, the pinned layer 14 is located above the free layer 18. Namely, the manufacturing method according to the present invention can be applied for both of the top type CCP-CPP element and the bottom type CCP-CPP element. In Example 2, the spacer layer 16 can be formed in the same manner as Example 1. In FIG. 1, the free layer 18 is located under the spacer layer 16 instead of the top pinned layer and the pinned layer 14 is located above the spacer layer 16 instead of the free layer 18.

The top type CCP-CPP element was formed as described below.

| Bottom electrode 11 | |
| --- | --- |
| Underlayer 12: | Ta 3 nm/Ru 2 nm |
| Free layer 18: | $Ni_{83}Fe_{17}$ 3.5 nm/$Co_{90}Fe_{10}$ 1 nm |
| Metallic layer 15: | Cu 0.5 nm |
| Spacer layer (CCP-NOL) 16: | Insulating layer 161 of $Al_2O_3$ and current confined path 162 of Cu |
| Metallic layer 17: | Cu 0.25 nm |
| Pinned layer 14: | $Fe_{50}Co_{50}$ 1 nm/Cu 0.25 nm × 2/$Fe_{50}Co_{50}$ 1 nm/Ru 0.9 nm/$Co_{90}Fe_{10}$ 3.6 nm |
| Pinning layer 13: | $Ir_{22}Mn_{78}$ 7 nm |
| Cap layer 19: | Cu 1 nm/Ru 10 nm |
| Top electrode 20 | |

In the manufacture of the top type CCP-CPP element, the pinning layer 13 through the free layer 18, which are located between the underlayer 12 and the cap layer 19, are formed in reverse order. However, the bottom metallic layer 13 and the top metallic layer are not formed in reverse order. Therefore, the function of the metallic layers m1, m2, m3 and m4 in the bottom type CCP-CPP element is the same as the function of the top type CCP-CPP element.

(Application of Magneto-Resistance Effect Element)

The application of the magneto-resistance effect element (CCP-CPP element) according to this embodiment will be described hereinafter, In view of high density recording, the element resistance RA is set preferably to 500 m$\Omega\mu m^2$ or below, more preferably to 300 m$\Omega\mu m^2$ or below. In the calculation of the element resistance RA, the effective area A in current flow of the spin valve film is multiplied to the resistance R of the CPP-CPP element. Herein, the element resistance R can be directly measured, but attention should be paid to the effective area A because the effective area A depends on the element structure.

If the whole area of the spin valve film is effectively sensed by current through patterning, the whole area of the spin valve film corresponds to the effective area A. In this case, the whole area of the spin valve film is set to 0.04 $\mu m^2$ or below in view of the appropriate element resistance, and to 0.02 $\mu m^2$ or below in view of the recording density of 200 Gbpsi or over.

If the area of the bottom electrode 11 or the top electrode 20 is set smaller than the whole area of the spin valve film, the area of the bottom electrode 11 or the top electrode 20 corresponds to the effective area A.

If the area of the bottom electrode 11 is different from the area of the top electrode 20, the smaller area of either of the bottom electrode 11 or the top electrode 20 corresponds to the effective area A. As described above, the smaller area is set to 0.04 $\mu m^2$ or below in view of the appropriate element resistance Referring to FIGS. 6 and 7, since the smallest area of the spin valve film 10 corresponds to the contacting area with the top electrode 20 as apparent from FIG. 6, the width of the smallest area can be considered as a track width Tw. Then, since the smallest area of the spin valve film 10 in MR height direction also corresponds to the contacting area with the top electrode 20 as apparent from FIG. 7, the width of the smallest are can be considered as a height length D. In this case, the effective area A can be calculated on the equation of A=Tw× D.

In the magneto-resistance effect element according to this embodiment, the resistance R between the electrodes can be reduced to 100$\Omega$ or below, which corresponds to the resistance between the electrode pads in the read head attached to the forefront of a head gimbal assembly (HGA), for example.

It is desired that the magneto-resistance effect element is structured in fcc (111) orientation when the pinned layer 14 or the free layer 18 has the fcc-structure. It is also desired that the magneto-resistance effect element is structured in bcc (100) orientation when the pinned layer 14 or the free layer 18 has the bcc-structure. It is also desired that the magneto-resistance effect element is structured in hcp (001) orientation when the pinned layer 14 or the free layer 18 has the hcp-structure.

The crystalline orientation of the magneto-resistance effect element according to this embodiment is preferably 4.5 degrees or below, more preferably 3.5 degrees or below and particularly 3.0 degree or below in view of the dispersion of orientation. The crystalline orientation can be measured from the FWHM of X-ray rocking curve obtained from the θ-2θ measurement in X-ray diffraction. The crystalline orientation can be also measured by the spot scattering angle originated from the nano-diffraction spots of the element cross section.

Depending on the kind of material of the antiferromagnetic film, since the lattice spacing of the antiferromagnetic film is different from the lattice spacing of the pinned layer 14/CCP-NOL layer 16/free layer 18, the dispersion in crystalline orientation can be obtained between the antiferromagnetic film and the pinned layer 14/CCP-NOL layer 16/free layer 18. For example, the lattice spacing of the PtMn antiferromagnetic layer is often different from the lattice spacing of the pinned layer 14/CCP-NOL layer 16/free layer 18. In this point of view, since the PtMn layer is formed thicker, the PtMn layer is suitable for the measurement in dispersion of the crystal orientation. With the pinned layer 14/CCP-NOL layer 16/free layer 18, the pinned layer 14 and the free layer 18 may have the respective different crystal structures of bcc-structure and fcc-structure. In this case, the dispersion angle in crystal orientation of the pinned layer 14 may be different from the dispersion angle in crystal orientation of the free layer 18.

(Magnetic Head)

Figure 6:
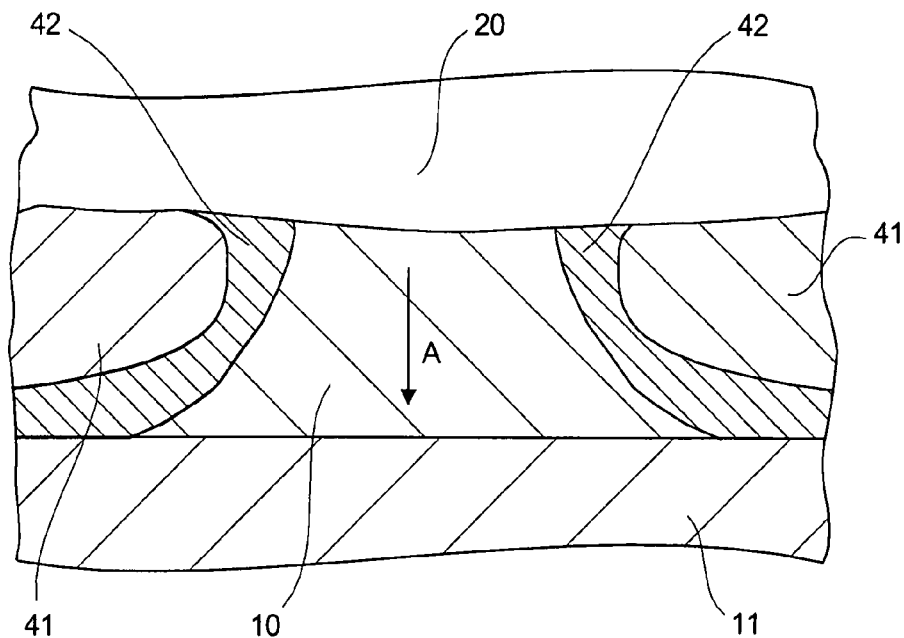
FIG. 6 is a cross sectional view showing the state where the magneto-resistance effect element in the embodiment is incorporated in a magnetic head.
Figure 7:
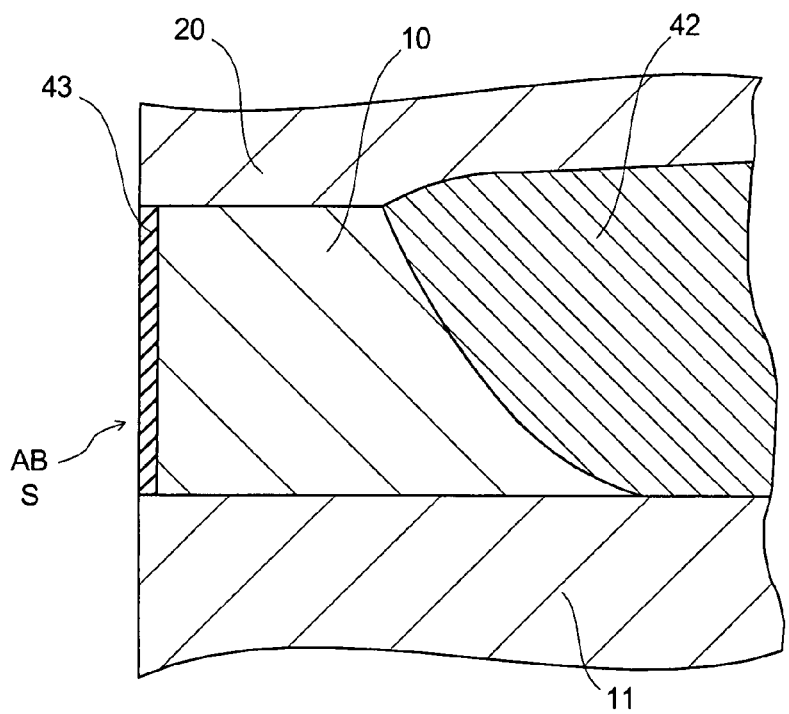
FIG. 7 is another cross sectional view showing the state where the magneto-resistance effect element in the embodiment is incorporated in a magnetic head.

FIGS. 6 and 7 are cross sectional views showing the state where the magneto-resistance effect element according to this embodiment is incorporated in a magnetic head. FIG. 6 is a cross sectional view showing the magneto-resistance effect element, taken on the surface almost parallel to the ABS (air bearing surface) opposite to a (not shown) magnetic recording medium. FIG. 7 is a cross sectional view showing the magneto-resistance effect element, taken on the surface almost perpendicular to the ABS.

The magnetic head shown in FIGS. 6 and 7 has a so-called hard abutted structure. The magneto-resistance effect film 10 is the CCP-CPP film as described above. The bottom electrode 11 and the top electrode 20 are provided on the top surface and the bottom surface of the magneto-resistance effect film 10, respectively. In FIG. 6, the biasing magnetic applying films 41 and the insulating films 42 are formed at the both sides of the magneto-resistance effect film 10. In FIG. 7, the protective layer 43 is formed on the ABS of the magneto-resistance effect film 10.

The sense current is flowed along the arrow A through the magneto-resistance effect film 10 between the bottom electrode 11 and the top electrode 20, that is, in the direction perpendicular to the film surface of the magneto-resistance effect film 10. Moreover, a given biasing magnetic field is applied to the magneto-resistance effect film 10 from the biasing magnetic field applying films 41 so as to render the domain structure of the free layer 18 of the film 10 a single domain structure through the control of the magnetic anisotropy of the free layer 18 and stabilize the magnetic domain structure of the free layer 18. In this case, the Barkhausen noise due to the shift of magnetic wall in the magneto-resistance effect film 10 can be prevented. Since the S/N ratio of the magneto-resistance effect film 10 is enhanced, the magnetic head including the magneto-resistance effect film 10 can realize the high sensitive magnetic reproduction.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 8:
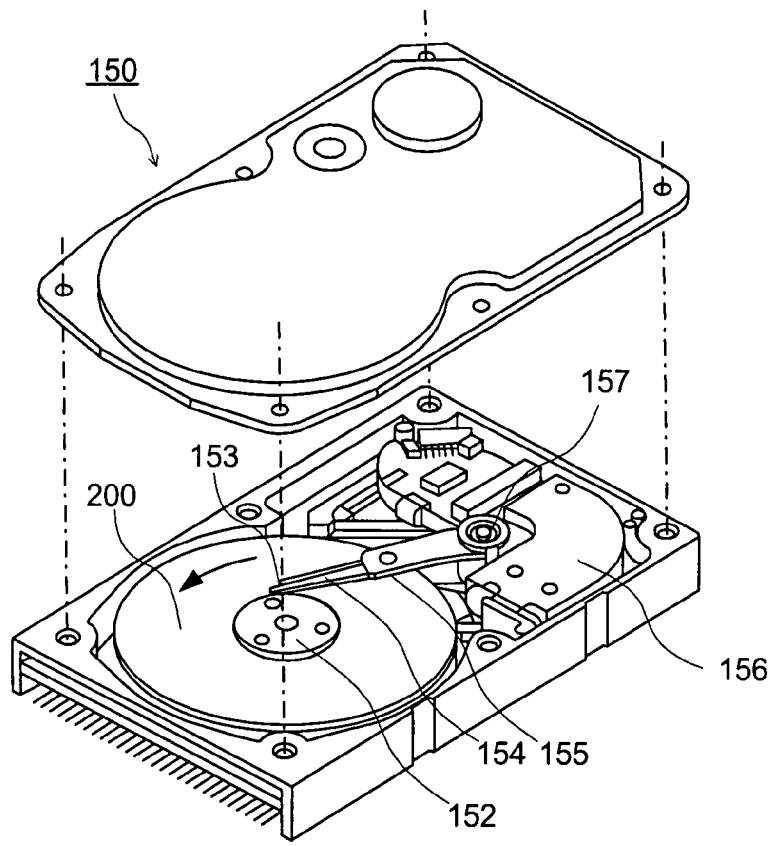
FIG. 8 is a perspective view illustrating an essential part of a magnetic recording/reproducing device according to the present invention.

FIG. 8 is a perspective view illustrating the schematic structure of the magnetic recording/reproducing device. The magnetic recording/reproducing device 150 illustrated in FIG. 8 constitutes a rotary actuator type magnetic recording/reproducing device. In FIG. 8, a magnetic recording disk 200 is mounted to a spindle 152 to be turned in the direction designated by the arrow A by a motor (not shown) which is driven in response to control signals from a drive unit controller (not shown). In FIG. 8, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200.

The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 9:
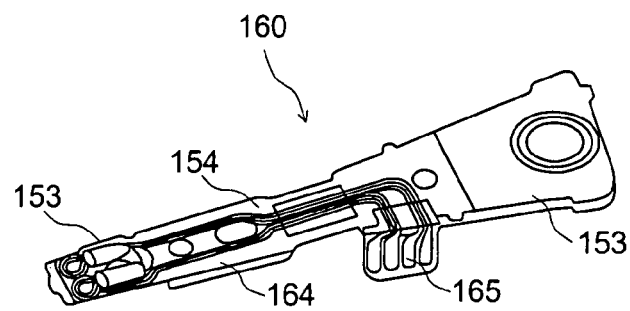
FIG. 9 is an enlarged perspective view illustrating the magnetic head assembly of the magnetic recording/reproducing device which is located forward from the actuator arm, as viewed from the side of the disk.

FIG. 9 is an enlarged perspective view illustrating a portion of the magnetic head assembly positioned at the tip side thereof from the actuator arm 155, as viewed from the side of the magnetic recording disk 200. As illustrated in FIG. 9, the magnetic head assembly 160 has the actuator arm 155 with the bobbin portion supporting the driving coil and the like. The suspension 154 is connected with the one edge of the actuator arm 155. Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 8 and 9, since the magneto-resistance effect element as described in the above embodiments is installed, the information magnetically recorded in the magnetic recording disk 200 can be read out properly.

(Magnetic Memory)

The magneto-resistance effect element as described above can constitute a magnetic memory such as a magnetic random access memory (MRAM) where memory cells are arranged in matrix.

Figure 10:
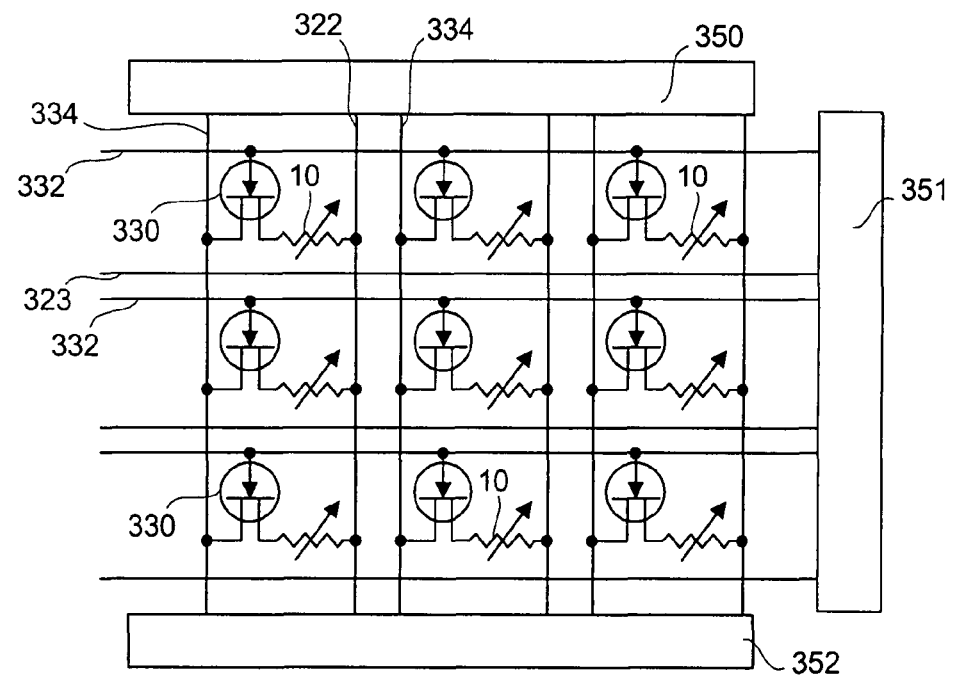
FIG. 10 is a view illustrating a magnetic memory matrix according to the present invention.

FIG. 10 is a view illustrating an embodiment of the magnetic memory matrix according to the present invention. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be read out by being detected by a sense amplifier 352. In order to write the bit information, a writing current is flowed in a specific write word line 323 and a bit line 322 to generate a magnetic field for writing.

Figure 11:
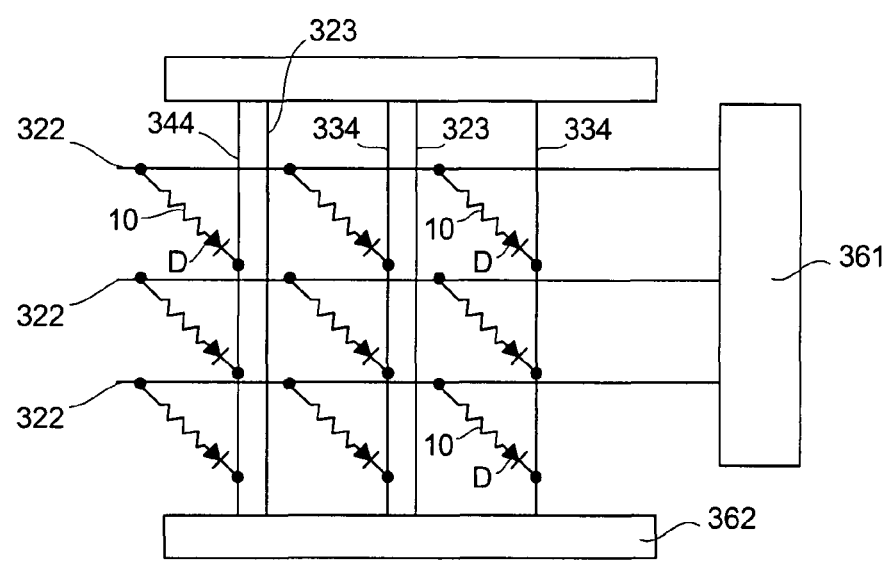
FIG. 11 is a view illustrating another magnetic memory matrix according to the present invention.

FIG. 11 is a view illustrating another embodiment of the magnetic memory matrix according to the present invention. In this case, a bit line 322 and a word line 334 which are arranged in matrix are selected by decoders 360, 361, respectively, so that a specific memory cell in the array is selected. Each memory cell is configured such that the magneto-resistance effect film 10 and a diode D is connected in series. Here, the diode D plays a role of preventing a sense current from detouring in the memory cell other than the selected magneto-resistance effect film 10. A writing is performed by a magnetic field generated by flowing the writing current in the specific bit line 322 and the word line 323, respectively.

Figure 12:
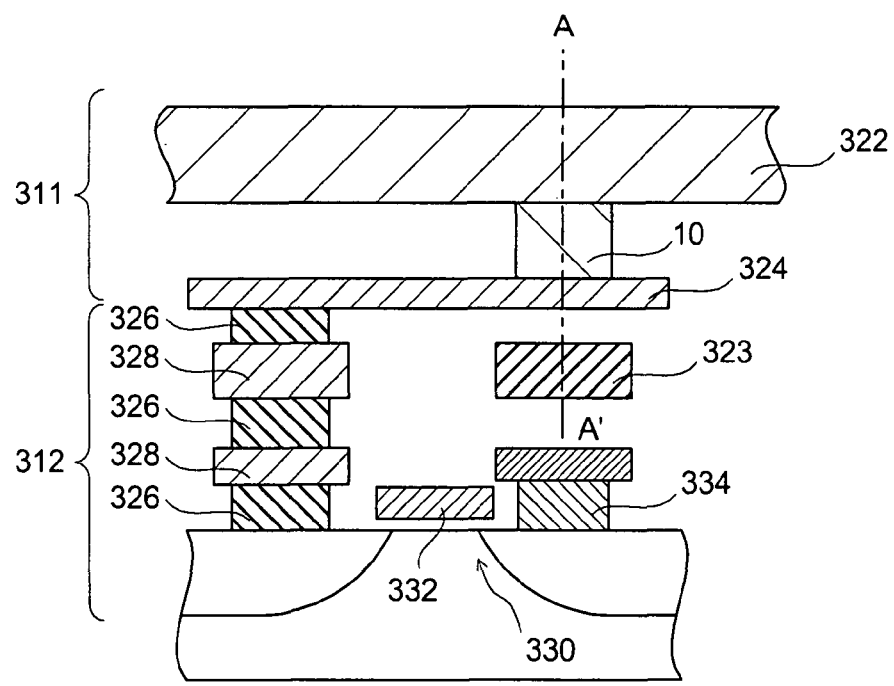
FIG. 12 is a cross sectional view illustrating an essential part of the magnetic memory.
Figure 13:
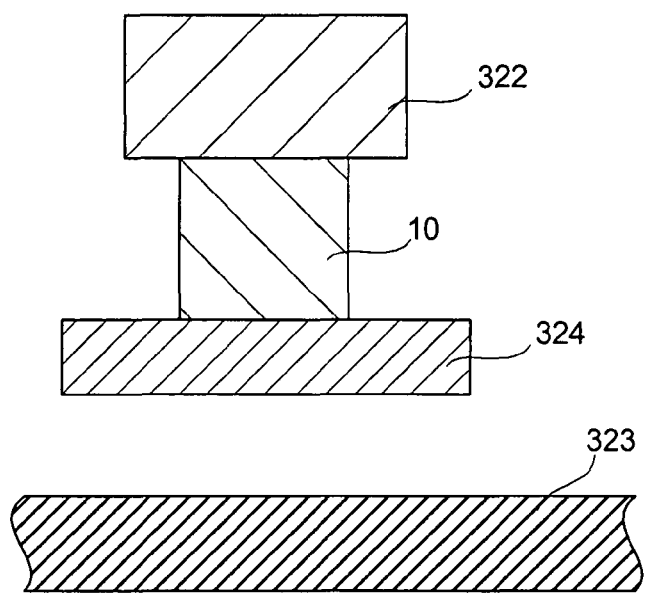
FIG. 13 is a cross sectional view of the magnetic memory illustrated in FIG. 12, taken on line "A-A'".

FIG. 12 is a cross sectional view illustrating a substantial portion of the magnetic memory in an embodiment according to the present invention. FIG. 13 is a cross sectional view of the magnetic memory illustrated in FIG. 12, taken on line "A-A'". The configuration shown in these drawings corresponds to a 1-bit memory cell included in the magnetic memory shown in FIG. 10 or FIG. 11. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current confined path between the magneto-resistance effect film 10 and the wiring 334.

Further, below the magneto-resistance effect film 10, a write wiring 323 is provided in the direction substantially orthogonal to the wiring 322. These write wirings 322, 323 can be formed of, for example, aluminum (Al), copper (Cu), tungsten (W), tantalum (Ta) or an alloy containing any of these elements.

In the memory cell of such a configuration, when writing bit information into the magneto-resistance effect element 10, a writing pulse current is flowed in the wirings 322, 323, and a synthetic magnetic field induced by the writing current is applied to appropriately invert the magnetization of a recording layer of the magneto-resistance effect element 10.

Further, when reading out the bit information, a sense current is flowed through the magneto-resistance effect element 10 including the magnetic recording layer and a lower electrode 324 to measure a resistance value of or a fluctuation in the resistance values of the magneto-resistance effect element 10.

The magnetic memory according to the embodiment can assure writing and reading by surely controlling the magnetic domain of the recording layer even though the cell is miniaturized in size, with the use of the magneto-resistance effect element (CCP-CPP element) according to the above-described embodiment.

Another Embodiment

Although the present invention was described in detail with reference to the above examples, this invention is not limited to the above disclosure and every kind of variation and modification may be made without departing from the scope of the present invention.

The concrete structure of the magneto-resistance effect element, and the shape and material of the electrodes, the magnetic field biasing films and the insulating layer can be appropriately selected among the ones well known by the person skilled in the art. In these cases, the intended magneto-resistance effect element according to the present invention can be obtained so as to exhibit the same effect/function as described above.

When the magneto-resistance effect element is applied for a reproducing magnetic head, the detecting resolution of the magnetic head can be defined by applying magnetic shielding for the upper side and the lower side of the magneto-resistance effect element. Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device. The magnetic recording/reproducing device may be a so-called stationary type magnetic device where a specific recording medium is installed therein or a so-called removable type magnetic device where a recording medium can be replaced.

What is claimed is:

1. A method for manufacturing a magneto-resistance effect element having a pinned magnetic layer of which a magnetization is fixed substantially in one direction, a free magnetization layer of which a magnetization is rotated in accordance with an external magnetic field and a spacer layer, which is located between said fixed magnetization layer and said free magnetization layer, comprising:
   forming a first metallic layer;
   forming, on said first metallic layer, a second metallic layer;
   performing a first conversion treatment so as to convert said second metallic layer into a first insulating layer and to form a first metallic portion layer penetrating through the first insulating layer;
   forming, on the first insulating layer and the first metallicorion, a third metallic layer; and
   performing a second conversion treatment so as to convert said third metallic layer into a second insulating layer and to form a second metallic portion layer penetrating through the second insulating layer.

2. The manufacturing method as set forth in claim 1, further comprising forming a fourth metallic layer between the first insulating layer and the first metallic portion, and said third metallic layer.

3. The manufacturing method as set forth in claim 2, wherein said fourth metallic layer is made of a material containing at least one selected from the group consisting of Cu, Au, Ag, and Al.

4. The manufacturing method as set forth in claim 3, wherein a thickness of said fourth metallic layer is set within 0.1 to 1.5 nm.

5. The manufacturing method as set forth in claim 1, wherein at least one of said first conversion treatment and said second conversion treatment is carried out by oxidizing, nitriding and/or oxynitriding said second metallic layer or said third metallic layer under ionized gas atmosphere or plasma gas atmosphere generated by ionizing or rendering plasma a gas containing at least one of Ar, Xe, He, Ne and Kr.

6. The manufacturing method as set forth in claim 1, wherein at least one of said first conversion treatment and said second conversion treatment is performed in a chamber and comprises:
   oxidizing, nitriding and/or oxynitriding said second metallic layer or said third metallic layer under ionized gas atmosphere or plasma gas atmosphere generated by ionizing or rendering plasma a gas containing at least one of Ar, Xe, He, Ne and Kr while at least one of oxygen gas, nitrogen gas and oxynitrogen gas is flowed; and
   irradiating an ionized gas or a plasma gas to said second metallic layer or said third metallic layer while said at least one of oxygen gas, nitrogen gas and oxynitrogen gas is stopped to be flowed into the chamber.

7. The manufacturing method as set forth in claim 1, wherein at least one of said first conversion treatment and said second conversion treatment comprises:
   irradiating an ionized gas or a plasma gas to said second metallic layer or said third metallic layer, said ionized gas atmosphere and said plasma gas atmosphere generated by ionizing or rendering plasma a gas containing at least one of Ar, Xe, He, Ne and Kr; and
   oxidizing, nitriding and/or oxynitriding said second metallic layer or said third metallic layer under said ionized gas atmosphere or said plasma gas atmosphere.

8. The manufacturing method as set forth in claim 1, wherein at least one of said first conversion treatment and said second conversion treatment is performed in a chamber and comprises:
   irradiating an ionized gas or a plasma gas to said second metallic layer or said third metallic layer, said ionized gas atmosphere and said plasma gas atmosphere generated by ionizing or rendering plasma a gas containing at least one of Ar, Xe, He, Ne and Kr;
   oxidizing, nitriding and/or oxynitriding said second metallic layer or said third metallic layer under said ionized gas atmosphere or said plasma gas atmosphere; and
   irradiating said ionized gas or said plasma gas to said second metallic layer or said third metallic layer after said at least one of oxygen gas and nitrogen gas is stopped to be flowed into the chamber.

9. The manufacturing method as set forth in claim 1, wherein said first metallic layer is made of a material containing at least one selected from the group consisting of Cu, Au, Ag, and Al, and said second metallic layer and said third metallic layer are made of respective materials containing at least one selected from the group consisting of Al, Si, Mg, Ti, Hf, Zr, Cr, Mo, Nb and W.

10. The manufacturing method as set forth in claim 9,
wherein a thickness of said first metallic layer is set within 0.1 to 1.5 nm, and a thickness of said second metallic layer and a thickness of said third metallic layer are set within 0.3 to 1 nm, respectively.

11. The manufacturing method as set forth in claim 1,
further comprising forming an additional metallic layer containing at least one selected from the group consisting of Cu, Au, Ag, and Al after said first conversion treatment and said second conversion treatment.

12. The manufacturing method as set forth in claim 1,
wherein at least one of said pinned magnetization layer and said free magnetization layer is made of an alloy containing Co and Fe.

13. The manufacturing method as set forth in claim 1,
wherein said pinned magnetization layer has a bcc-structure.

14. The manufacturing method as set forth in claim 1,
wherein said free magnetization layer includes a layer made of an alloy containing Ni and Fe.

* * * * *